US 9,412,733 B2

(12) United States Patent
Calafut et al.

(10) Patent No.: US 9,412,733 B2
(45) Date of Patent: Aug. 9, 2016

(54) MOSFET WITH INTEGRATED SCHOTTKY DIODE

(71) Applicant: Alpha & Omega Semiconductor Incorporated, Sunnyvale, CA (US)

(72) Inventors: Daniel Calafut, San Jose, CA (US); Yeeheng Lee, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 162 days.

(21) Appl. No.: 13/926,880

(22) Filed: Jun. 25, 2013

(65) Prior Publication Data
US 2014/0374824 A1  Dec. 25, 2014

(51) Int. Cl.
*H01L 29/78*   (2006.01)
*H01L 27/06*   (2006.01)
*H01L 29/872*  (2006.01)
*H01L 29/66*   (2006.01)
*H01L 29/10*   (2006.01)

(52) U.S. Cl.
CPC ........ *H01L 27/0629* (2013.01); *H01L 29/1095* (2013.01); *H01L 29/66143* (2013.01); *H01L 29/7811* (2013.01); *H01L 29/7827* (2013.01); *H01L 29/872* (2013.01)

(58) Field of Classification Search
CPC .............. H01L 29/872; H01L 29/1095; H01L 29/7811; H01L 29/66143; H01L 29/7827
USPC ......................................................... 257/334
See application file for complete search history.

(56) References Cited

U.S. PATENT DOCUMENTS

| 4,941,026 | A  | 7/1990  | Temple            |
|-----------|----|---------|-------------------|
| 5,998,833 | A  | 12/1999 | Baliga            |
| 6,251,730 | B1 | 6/2001  | Luo               |
| 7,109,552 | B2 | 9/2006  | Wu                |
| 7,183,610 | B2 | 2/2007  | Pattanayak et al. |
| 7,361,557 | B2 | 4/2008  | Inagawa et al.    |
| 7,476,589 | B2 | 1/2009  | Grebs et al.      |
| 7,652,326 | B2 | 1/2010  | Kocon             |
| 7,691,706 | B2 | 4/2010  | Kim               |
| 7,807,576 | B2 | 10/2010 | Pan               |

(Continued)

OTHER PUBLICATIONS

Co-Pending U.S. Appl. No. 14/566,294, to Madhur Bobde, filed Dec. 10, 2014.

(Continued)

*Primary Examiner* — Howard Weiss
*Assistant Examiner* — Tifney Skyles
(74) *Attorney, Agent, or Firm* — Joshua D. Isenberg; JDI Patent

(57) ABSTRACT

Aspects of the present disclosure describe a Schottky structure with two trenches formed in a semiconductor material. The trenches are spaced apart from each other by a mesa. Each trench may have first and second conductive portions lining the first and second sidewalls. The first and second portions of conductive material are electrically isolated from each other in each trench. The Schottky contact may be formed at any location between the outermost conductive portions. The Schottky structure may be formed in the active area or the termination area of a device die. It is emphasized that this abstract is provided to comply with rules requiring an abstract that will allow a searcher or other reader to quickly ascertain the subject matter of the technical disclosure. It is submitted with the understanding that it will not be used to interpret or limit the scope or meaning of the claims.

15 Claims, 16 Drawing Sheets

(56) References Cited

U.S. PATENT DOCUMENTS

| | | |
|---|---|---|
| 7,843,004 B2 | 11/2010 | Darwish |
| 7,910,439 B2 | 3/2011 | Darwish et al. |
| 8,247,296 B2 | 8/2012 | Grivna |
| 8,399,925 B2 | 3/2013 | Wang et al. |
| 8,466,513 B2 | 6/2013 | Grivna et al. |
| 8,575,695 B2 | 11/2013 | Bobde et al. |
| 8,664,065 B2 | 3/2014 | Grivna |
| 8,710,582 B2 | 4/2014 | Okumura et al. |
| 8,710,585 B1 | 4/2014 | Hu et al. |
| 8,753,935 B1 | 6/2014 | Bobde et al. |
| 8,809,948 B1 | 8/2014 | Yilmaz et al. |
| 9,029,215 B2 | 5/2015 | Hossain et al. |
| 2003/0127702 A1 | 7/2003 | Blair et al. |
| 2004/0014451 A1 | 1/2004 | Sapp et al. |
| 2005/0062124 A1 | 3/2005 | Chiola |
| 2005/0161758 A1 | 7/2005 | Chiola |
| 2006/0011976 A1 | 1/2006 | Darwish et al. |
| 2006/0249785 A1 | 11/2006 | Bhalla et al. |
| 2007/0134884 A1 | 6/2007 | Kim et al. |
| 2008/0035993 A1 | 2/2008 | Cao et al. |
| 2008/0073707 A1 | 3/2008 | Darwish |
| 2008/0179662 A1 | 7/2008 | Hshieh |
| 2008/0197408 A1 | 8/2008 | Disney et al. |
| 2008/0283956 A1 | 11/2008 | Hshieh et al. |
| 2009/0008706 A1 | 1/2009 | Yedinak et al. |
| 2009/0057756 A1 | 3/2009 | Hshieh |
| 2009/0085105 A1 | 4/2009 | Su et al. |
| 2009/0224312 A1 | 9/2009 | Taketani |
| 2009/0309156 A1 | 12/2009 | Darwish et al. |
| 2009/0315083 A1 | 12/2009 | Pan et al. |
| 2010/0001331 A1 | 1/2010 | Mikasa |
| 2010/0187642 A1 | 7/2010 | Grivna |
| 2011/0006363 A1 | 1/2011 | Hsieh |
| 2011/0049596 A1 | 3/2011 | Lee et al. |
| 2011/0121386 A1 | 5/2011 | Hsieh |
| 2011/0177662 A1 | 7/2011 | Yilmaz et al. |
| 2011/0177663 A1 | 7/2011 | Kachi |
| 2011/0284955 A1 | 11/2011 | Sapp et al. |
| 2012/0030644 A1 | 2/2012 | Lamant |
| 2012/0146090 A1 | 6/2012 | Lui et al. |
| 2012/0220091 A1 | 8/2012 | Challa et al. |
| 2012/0248566 A1 | 10/2012 | Bobde et al. |
| 2012/0276701 A1 | 11/2012 | Yedinak et al. |
| 2012/0292693 A1 | 11/2012 | Lee et al. |
| 2013/0002635 A1 | 1/2013 | Yamashita et al. |
| 2013/0020577 A1* | 1/2013 | Hsieh ................ H01L 27/0629 257/66 |
| 2013/0020671 A1 | 1/2013 | Lee et al. |
| 2013/0119394 A1 | 5/2013 | Zhu et al. |
| 2013/0168761 A1* | 7/2013 | Hsieh ................ H01L 29/407 257/330 |
| 2013/0207172 A1 | 8/2013 | Hsieh |
| 2013/0248995 A1 | 9/2013 | Nishiwaki et al. |
| 2013/0330892 A1 | 12/2013 | Hsieh |
| 2014/0048846 A1 | 2/2014 | Lui et al. |
| 2014/0097491 A1 | 4/2014 | Bulucea |
| 2014/0170823 A1 | 6/2014 | Lin |
| 2014/0175536 A1 | 6/2014 | Lee et al. |
| 2014/0239382 A1 | 8/2014 | Bobde et al. |
| 2014/0239388 A1 | 8/2014 | Lee et al. |
| 2014/0239436 A1 | 8/2014 | Hu et al. |
| 2014/0264567 A1 | 9/2014 | Challa |
| 2014/0339630 A1 | 11/2014 | Yilmaz et al. |

OTHER PUBLICATIONS

Non-Final Office Action for U.S. Appl. No. 13/776,523, dated Sep. 25, 2014.

U.S. Appl. No. 14/329,806, entitled Device Structure and Methods of Making High Density MOSFETS for Load Switch and DC-DC Applications to Hamza Yilmaz, filed Jul. 11, 2014.

Non-Final Office Action for U.S. Appl. No. 14/606,928, dated Apr. 10, 2015.

Notice of Allowance for U.S. Appl. No. 13/776,523, dated Apr. 6, 2015.

Notice of Allowance for U.S. Appl. No. 14/329,806, dated May 6, 2015.

Non-Final Office Action for U.S. Appl. No. 14/807,633, dated Oct. 8, 2015.

Non-Final Office Action for U.S. Appl. No. 14/566,294, dated Jul. 14, 2015.

Notice of Allowance for U.S. Appl. No. 14/606,928, dated Jul. 1, 2015.

Notice of Allowance for U.S. Appl. No. 14/566,294, dated Sep. 17, 2015.

Non-Final Office Action for U.S. Appl. No. 14/937,636, dated Feb. 8, 2016.

Non-Final Office Action U.S. Appl. No. 14/845,128, dated Dec. 22, 2015.

Notice of Allowance for U.S. Appl. No. 14/807,633, dated Feb. 1, 2016.

Notice of Allowance for U.S. Appl. No. 14/937,636, dated May 23, 2016.

* cited by examiner

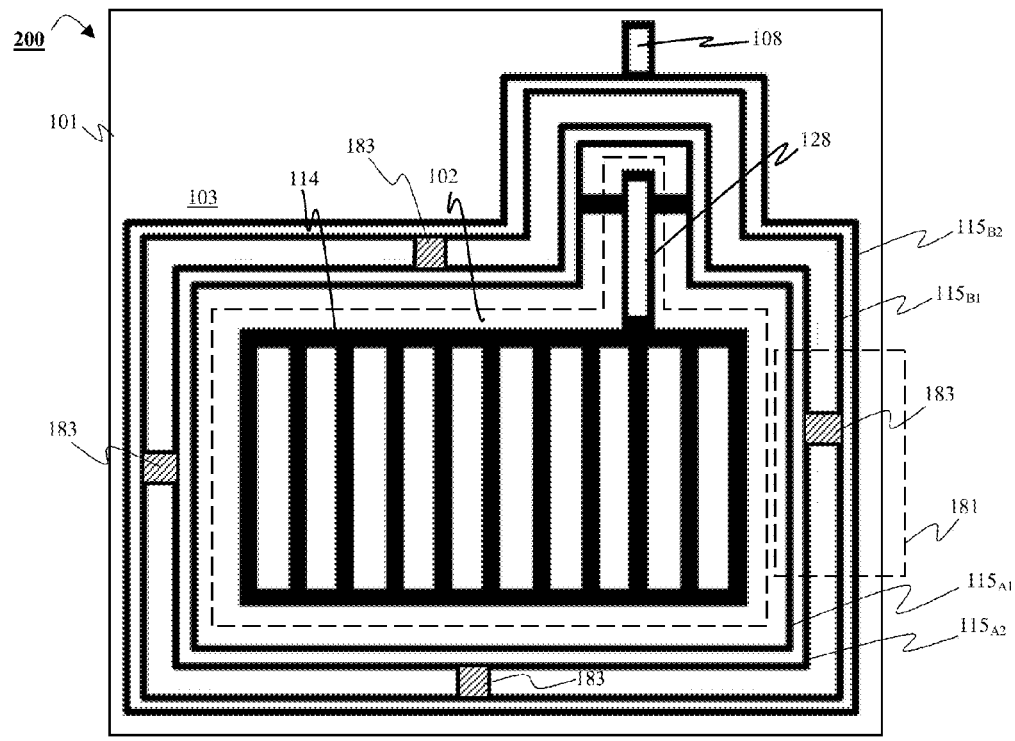
FIG. 2A
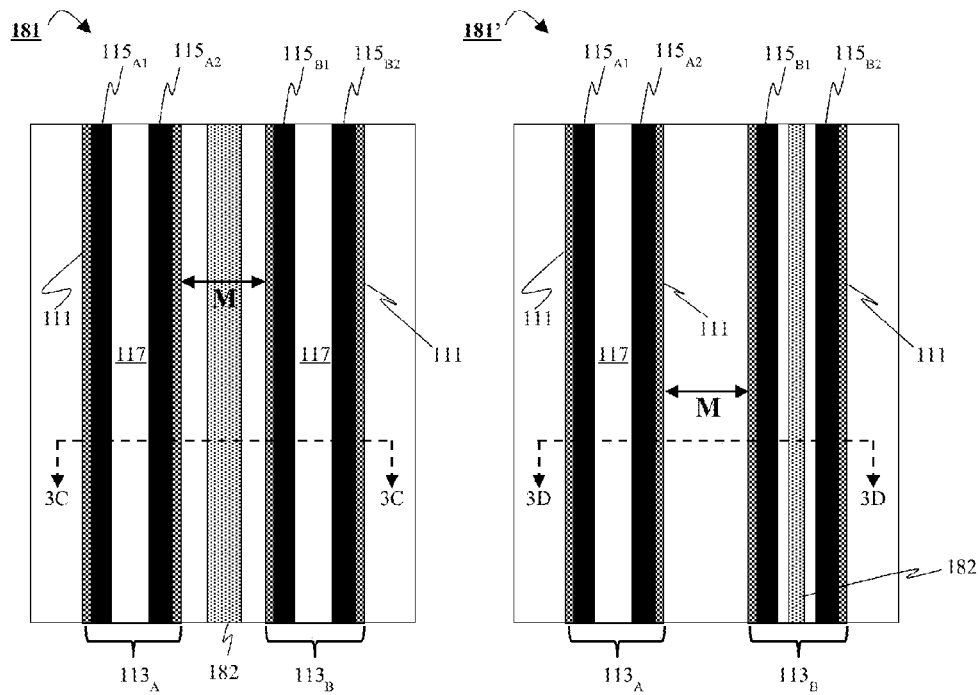
FIG. 2B  FIG. 2C

MOSFET WITH INTEGRATED SCHOTTKY DIODE

CROSS-REFERENCE TO RELATED APPLICATION

This application is related to commonly-assigned, co-pending application Ser. No. 13/776,523, filed Feb. 25, 2013, and entitled "TERMINATION TRENCH FOR POWER MOSFET APPLICATIONS", the entire disclosures of which are incorporated herein by reference.

FIELD OF THE INVENTION

This invention generally relates to power device structures and a method for manufacturing the device thereof. Specifically, the invention is directed to a method to implement an integrated Schottky diode into system that can include both active and passive devices and all the devices made from the method.

BACKGROUND OF THE INVENTION

Metal-oxide-semiconductor field-effect transistors (MOSFETs) are used for amplifying or switching electronic signals. A MOSFET device used for power switching is sometimes referred to as a power MOSFET. Power MOSFET devices typically contain multiple individual MOSFET structures arranged in active cells. The switching frequency of MOSFET devices are limited by device characteristics, largely capacitances, and in the case of certain applications, namely DC-DC converters, the recovery of the parasitic diode inherent in all power MOSFET device structures. In the latter case, Schottky diodes are commonly connected in parallel to the MOSFET devices to improve the diode recovery portion of the devices switching behavior. Additionally, Schottky diodes have an added benefit of a lower forward diode voltage drop, which suppresses power loss in the non-switching portion of device operation.

However, the use of a Schottky diode in parallel with the MOSFET devices does have some drawbacks. First, Schottky diodes typically have high reverse bias current leakage which adversely affects the performance of the device. Additionally, the integration of a Schottky diode into an MOSFET device utilizes valuable space on the die that could otherwise be used for additional active devices. Further, the integration of a Schottky diode may increase the cost of manufacturing the MOSFET devices because additional mask sets may be needed to form the Schottky diode. Therefore, there is a need in the art for a Schottky diode that has minimal leakage and can be integrated into the device in a space conscious manner without needing additional masks.

It is within this context that embodiments of the present invention arise.

BRIEF DESCRIPTION OF THE DRAWINGS

FIG. 2A is an overhead view depicting the layout of a device die where the Schottky structure is formed in the termination region according to an aspect of the present disclosure.

FIGS. 2B-2C are zoomed in views of the Schottky structure shown in FIG. 2A according to various aspects of the present disclosure.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," "first," "second," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. that are within the recited limits.

In the following discussion, devices with an N-type epitaxial layer and a P-type top layer are described for purposes of illustration. Substantially similar devices may be fabricated using a similar process but with opposite conductivity types.

Figure 1A:
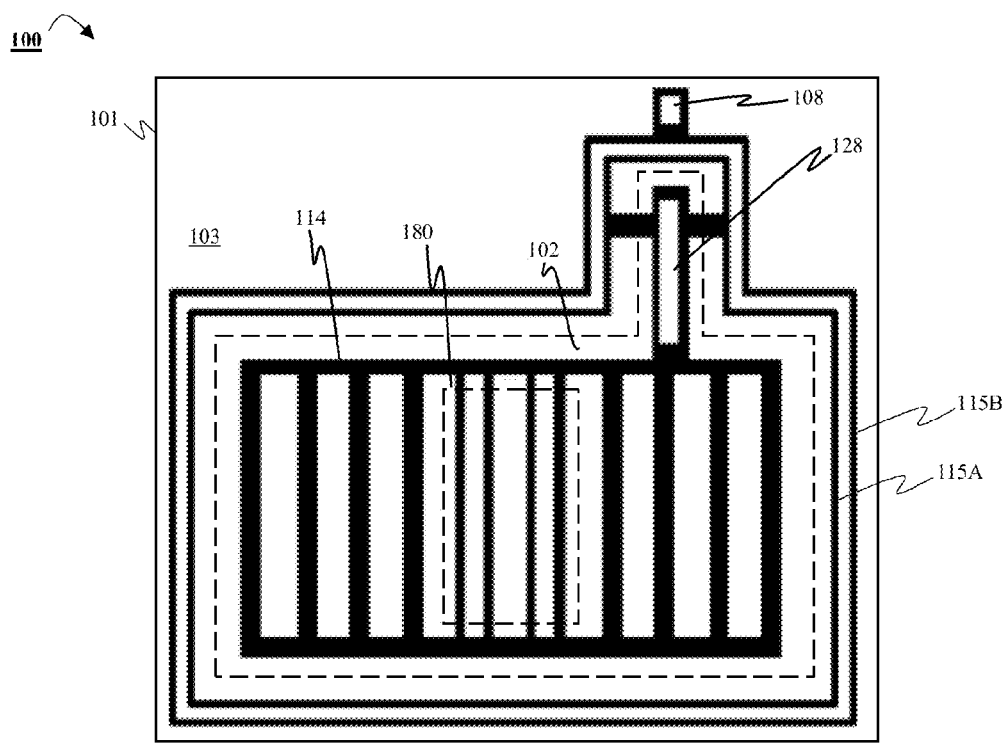
FIG. 1A is an overhead view depicting the layout of a device die where the Schottky structure is formed in the active area according to an aspect of the present disclosure.

FIG. 1A is an overhead view of a device structure 100 that is formed on a semiconductor substrate 101. The device structure 100 includes an active area 102 that is formed within the outermost dotted box. The region outside of the dotted box may be considered the termination region 103. One or more termination trenches may be located in the termination region. In device structure 100 there is a single termination trench (not shown) that has two separate conductive portions 115A and 115B formed within the trench. One of the conductive portions 115A and 115B in the one or more termination trenches may be connected to a drain contact 108. A conductive portion 115A in a termination trench nearest to the active area 102 may be connected to the gate contact 128. By way of example, and not by way of limitation, the termination trenches may be substantially similar to termination trenches described in related patent application Ser. No. 13/776,523 filed Feb. 25, 2013 and entitled "TERMINATION TRENCH FOR POWER MOSFET APPLICATIONS" by Lee et al, which is incorporated herein in its entirety.

In the active area 102 the gate electrodes 114 of the active device structures are shown. The device trenches in the active area may be lined with a dielectric material (not shown) and filled with a conductive material to form gate electrodes 114. The gate electrodes 114 may be connected to the gate metal (not shown) with a gate contact 128. The gate electrodes 114 are shown in a striped orientation, but alternative aspects of the present disclosure may also include alternative device layouts, such as, but not limited to a closed cell orientation. The gate contact 128 may be formed with a conductive material such as tungsten. Gate contact 128 may extend perpendicular to the plane of the drawing to make electrical contact with the gate metal (not shown). The gate metal may be initially formed as part of the same metal layer as the source metal (not shown). The gate metal may be electrically isolated from the source metal, e.g., by masking, etching and dielectric fill processes, as are commonly done for this purpose. Additionally, a Schottky structure 180 is formed in the active area 102. In FIG. 1A, only the conductive portions 115A and 115B of the Schottky structure 180 are shown. A zoomed in overhead view of various Schottky structures according to various aspects of the present disclosure are shown in FIGS. 1B and 1C.

Figure 1B:
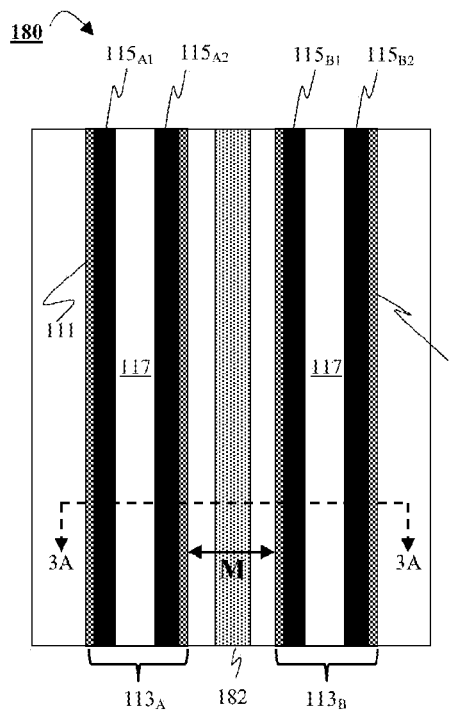
FIGS. 1B-1C are zoomed in views of the Schottky structure shown in FIG. 1A according to various aspects of the present disclosure.

FIG. 1B depicts two trenches $113_A$ and $113_B$ running parallel to each other. The two trenches may be spaced apart from each other by a mesa M. The width of the mesa M may be less than or equal to the width of a device mesa that separates device trenches from each other. The width of the mesa M may be chosen such that the depletion regions formed along the sides of the trenches $113_A$ and $113_B$ proximate to the mesa M merge together to a degree that allows suitable control over of the reverse blocking state leakage, but not so constricting as to increase the diode forward voltage (of the diode) to a considerable degree, thereby preventing the Schottky diode from functioning as an effective means to mitigate (power) loss. By way of example, and not by way of limitation, the width of the mesa M may be approximately between one-fourth and three-fourths of the width of the mesa between active device structures. The sidewalls of each trench may be lined with a dielectric material 111. A conductive material 115 may be disposed proximate to each lined trench wall. As such each trench has a first and second conductive portion. The two conductive portions 115 in each trench are electrically isolated from each other by an insulative material 117, such as an oxide. As shown in FIG. 1B the first conductive portion $115_{A1}$ is separated from the second conductive portion $115_{A2}$ in trench $113_A$ and the first conductive portion $115_{B1}$ is separated from the second conductive portion $115_{B2}$ in trench $113_B$. The conductive portions 115 and the gate electrodes 114 may be made from the same material, e.g., polysilicon, which may be formed in corresponding trenches in a common step. Between the two trenches there may be a Schottky contact 182 formed. By way of example, and not by way of limitation, the Schottky contact 182 may be made of tungsten that is deposited by CVD.

Figure 1C:
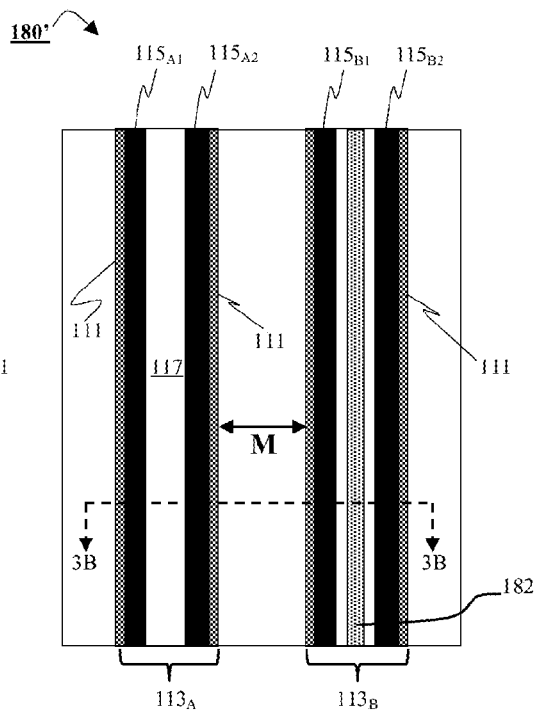

FIG. 1C depicts an overhead view of a Schottky structure 180' according to an additional aspect of the present disclosure. The structure 180' is substantially similar to the Schottky structure 180 except that the location of the Schottky contact 182 has been changed. Instead of being formed in the mesa M, the Schottky contact 182 may be formed between the first and second conductive portions $115_{B1}$ and $115_{B2}$. The Schottky contact 182 extends through the bottom of the trench $113_B$ in order to create the contact with the substrate 101 below the trench. While a single Schottky contact 182 is shown in FIG. 1C, aspects of the present disclosure also include structures in which there is a Schottky contact 182 in between the first and second portions 115 in both trenches $113_A$ and $113_B$. According to yet additional aspects of the present disclosure, a Schottky contact 182 may be formed in the mesa M, as shown in FIG. 1B and in between the conductive portions 115 in one or both trenches $113_A$ and $113_B$. Further, while the Schottky structure 180 is shown as a single strip in FIG. 1A, there may be more than one strip, or only a portion of a single strip depending on the specifications of the device 100.

FIG. 2A is an overhead view of an additional aspect of the present disclosure, in which the device 200 has a Schottky structure 181 formed in the termination region 103. In FIG. 2A the active device structures within the active region 102 may be substantially similar to the active device structures described with respect to FIGS. 1A-1C. FIG. 2A depicts only the conductive portions $115_{A1}$, $115_{A2}$ of a first trench $113_A$ and conductive portions $115_{B1}$ and $115_{B2}$ of a second trench $113_B$. Placing the Schottky structure in the termination region 103 saves room in the active region 102 for additional active device structures. In the example depicted in FIG. 2A, the conductive portions $115_{A2}$ and $115_{B1}$ may be electrically connected to each other by conductive shorts 183 to short the inner conductive portions $115_{A2}$ to source potential.

FIG. 2B is a zoomed in look at the termination Schottky structure 181 according to an aspect of the present disclosure. Two trenches $113_A$ and $113_B$ run parallel to each other. The two trenches may be spaced apart from each other by a mesa M. The width of the mesa M may be less than or equal to the width of a device mesa that separates device trenches from each other. The width of the mesa M can be chosen such that the depletion regions formed along the sides of the trenches $113_A$ and $113_B$ proximate to the mesa M merge together to a degree that allows suitable control over of the reverse blocking state leakage, but not so constricting as to increase the diode forward voltage (of the diode) to a considerable degree, thereby preventing the Schottky diode from functioning as an effective means to mitigate (power)loss. By way of example, and not by way of limitation, the width of the mesa M may be approximately between one-fourth and three-fourths of the width of the mesa between active device structures. The sidewalls of each trench may be lined with a dielectric material 111. A conductive material 115 may be disposed proximate to each lined trench wall. As such, each trench has a first and second conductive portion. The two conductive portions 115 in each trench are electrically isolated from each other by an insulative material 117, such as an oxide. As shown in FIG. 2B the first conductive portion $115_{A1}$ is separated from the second conductive portion $115_{A2}$ in trench $113_A$ and the first conductive portion $115_{B1}$ is separated from the second conductive portion $115_{B2}$ in trench $113_B$. The conductive portions 115 and the gate electrodes 114 of the active devices may be made from the same material, e.g., polysilicon, which may be formed in corresponding trenches in a common step. Between the two trenches there may be a Schottky contact 182 formed. By way of example, and not by way of limitation, the Schottky contact 182 may be made of tungsten that is deposited by CVD.

FIG. 2C depicts an overhead view of a Schottky structure 181' according to an additional aspect of the present disclosure. The structure 181' is substantially similar to the Schottky structure 181 except that the location of the Schottky contact 182 is different. Instead of being formed in the mesa M, the Schottky contact 182 may be formed between the first and second conductive portions $115_{B1}$ and $115_{B2}$. The Schottky contact 182 extends through the bottom of the trench $113_B$ in order to create a contact with the substrate 101 below the trench. While a single Schottky contact 182 is shown in FIG. 2C, aspects of the present disclosure also include structures in which there is a Schottky contact 182 in between the first and second portions 115 in both trenches $113_A$ and $113_B$. According to yet additional aspects of the present disclosure, a Schottky contact 182 may be formed in the mesa M, as shown in FIG. 2B and in between the conductive portions 115 in one or both trenches $113_A$ and $113_B$.

Figure 3A:
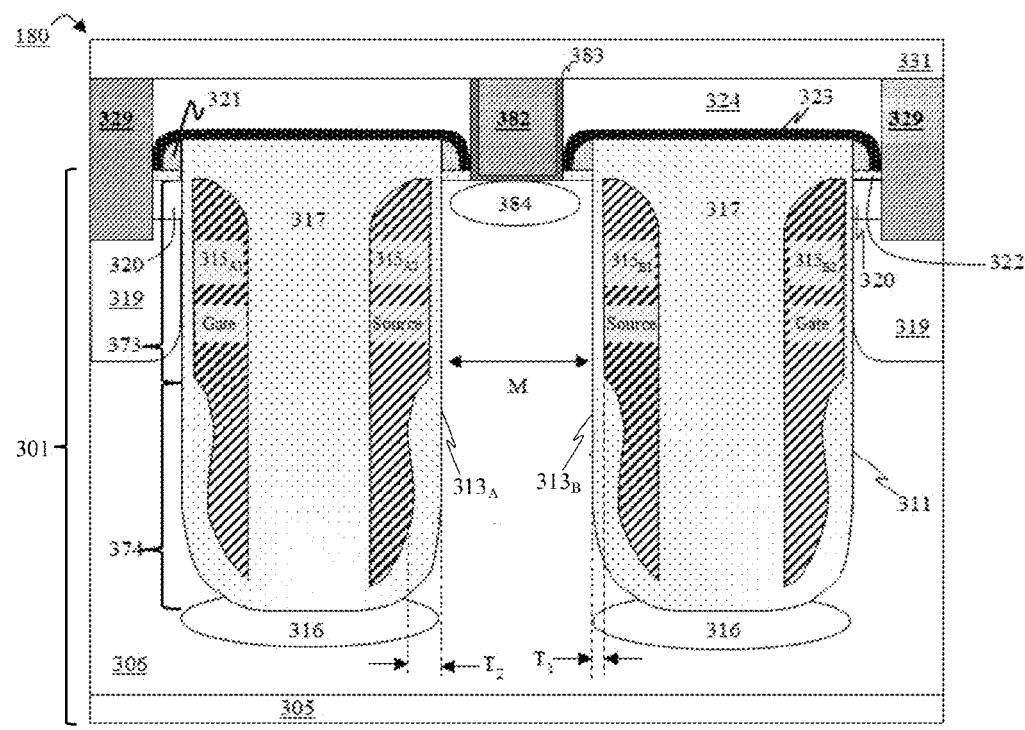
FIGS. 3A-3G are cross-sectional views of the Schottky structure according to various aspects of the present disclosure.

FIG. 3A is a cross-sectional view of the Schottky structure 180 along the line 3A-3A shown in FIG. 1B. Schottky structure 180 may be formed on a semiconductor substrate 301. Furthermore, a plurality of such Schottky structures 180 may be formed on the same substrate, as is common in semiconductor manufacturing. The substrate 301 may be suitably doped to be an N-type or a P-type substrate. By way of example, and not by way of limitation, the semiconductor substrate 301 may be an N-type silicon substrate. The semiconductor substrate may have a heavily doped N+ drain region 305. By way of example, the drain region 305 may have a doping concentration of approximately $10^{19}$ cm$^{-3}$ or greater. The drain region 305 may be electrically connected to a drain electrode (not shown) formed on a bottom surface of the semiconductor substrate. Above the drain region 305 may be a lightly doped N− drift region 306. By way of example, the drift region 306 may have a doping concentration that is approximately between about $10^{15}$ cm$^{-3}$ and about $10^{17}$ cm$^{-3}$. Above the drift region 306, except for in the mesa portion M, a suitably doped body layer 319 of a second conductivity type that is opposite to the first conductivity type of the semiconductor substrate may be formed. A source region 320 of the first conductivity type may be formed in a top portion of the body layer 319. By way of example, and as used throughout the remainder of the disclosure, the semiconductor substrate 301 may be an N-type semiconductor, the body region 319 may be a P-type, and the source region 320 may be N-type.

Two trenches $313_A$ and $313_B$ are formed into the substrate 301. The depth of the trenches $313_A$ and $313_B$ may be substantially similar to the depth of device trenches formed in the active area 102. The width of trenches $313_A$ and $313_B$ is wider than the width of the active device structures. The width of the trenches 313 in the Schottky structure 180 may be chosen such that when the device trenches are filled with a trench filling material to form the gate electrodes 114, the trench filling material will only line the sidewalls and bottom of the trenches $313_A$ and $313_B$. By way of example, and not by way of limitation, trenches $313_A$ and $313_B$ may be at least twice as wide as the device trenches, e.g., if the device trenches are approximately 0.5 microns wide, then the trenches $313_A$ and $313_B$ may be approximately 1.0 microns wide or greater. Each trench $313_A$ and $313_B$ may have an upper portion 373 and a bottom portion 374. A dielectric material 311 may line the walls of the trench. The dielectric material 311 may have a thickness $T_2$ in the bottom portion of the trench 374 and the dielectric material 311 may have a thickness $T_1$ in the upper portion of the trench 373. According to aspects of the present disclosure, the thickness $T_1$ is smaller than the thickness $T_2$.

The trench filling material that lines the side wall of the trench $313_A$ furthest from the mesa M may be referred to as the first portion of the conductive material $315_{A1}$ and the trench filling material that lines the wall of the trench $315_A$ proximate to the mesa M may be referred to as the second portion of the conductive material $315_{A2}$. The trench filling material that lines the side wall of the trench $313_B$ closest from the mesa M may be referred to as the first portion of the conductive material $315_{B1}$ and the trench filling material that lines the wall of the trench $315_B$ furthest from the mesa M may be referred to as the second portion of the conductive material $315_{B2}$.

In each trench the first and second portions of the conductive material are electrically isolated from each other by an insulative material 317. By way of example, the insulative material 317 may be an oxide. Electrically insulating the first and second portions of conductive material from each other allows for each portion to be maintained at an independent voltage. When the Schottky structure 180 is integrated into the active area of the device 100 it is desirable that the outermost conductive portions (i.e., the first conductive portion $315_{A1}$ in trench $313_A$, and the second conductive portion $315_{B2}$ in trench $313_B$) are maintained at gate potential. This allows for an active transistor device to be formed between the Schottky structure 180 and the device trenches formed adjacent to the Schottky structure 180. The interior conductive portions (i.e., the second conductive portion $315_{A2}$ in trench $313_A$ and the first conductive portion $315_{B1}$ in trench $313_B$) may be maintained at the source potential. Since the interior conductive portions $315_{A2}$, $315_{B1}$ extend the complete length of the trench, shielding for the Schottky contact may be maximized.

According to additional aspects of the present disclosure, an electrical field line tuning region 316 may be optionally formed beneath the trenches. The electrical field line tuning region 316 may be formed by doping the semiconductor substrate 301 below the trenches 313 with a P-type dopant, such as boron. The implantation dose may be adjusted to further control the distribution of the electrical field lines present in the Schottky structure 180. For example, boron can be implanted with a dose in a range of $2\,e^{11}$ to $5\,e^{12}$ atoms/cm$^2$ at an energy of about 30 to 80 KeV.

A first insulative spacer 321 may be disposed along each vertical edge of the insulative material 317 above the insulative layer 322. By way of example, and not by way of limitation, the first insulative spacer 321 may be the same material as the insulative material 317. Additionally, a second insulative layer 323 may be formed above the insulative material 317 and along the exposed sidewalls of the first insulative spacer 321. By way of example, and not by way of limitation, the first insulative spacer 321 may be made of a material that will resist an etchant that selectively removes the material that the second insulative layer 323 is made from. By way of example, the first insulative spacer 321 may be an oxide, and the second insulative layer 323 may be a nitride. The oxide is resistant to a hot phosphoric acid, while the nitride would be selectively etched away by the hot phosphoric acid. Additionally, the first insulative spacer 321 and the second insulative layer 323 may be made from the same insulative material, such as a nitride.

The combination of the first insulative spacers 321 and the second insulative layer 323 that are formed along the exposed sidewall of the first insulative spacer 321 above the outermost conductive portions $315_{A1}$, $315_{B2}$ allow for vertical connections 329 to be self-aligned between the Schottky structure 180 and the device trenches formed adjacent to the Schottky structure 180. An outer insulator 324 may be formed above the second insulative layer 323. By way of example, and not by way of limitation, the outer insulator 324 may be BPSG.

Between the trenches $313_A$, $313_B$ a Schottky contact 382 may be formed. The Schottky contact 382 connects the source metal layer 331 to the substrate 301. By way of example, and not by way of limitation, the Schottky contact 382 may be made from a conductive material such as tungsten. According to some aspects of the present disclosure, the Schottky contact 382 may be lined with a barrier metal 383 such as titanium, or a titanium nitride. By placing the Schottky contact 382 between the two trenches, the leakage of the Schottky diode may be reduced by the coupling between the trenches $313_A$ and $313_B$. In order to improve the performance of the Schottky contact, dopants may be implanted into the substrate 301 near the Schottky contact to form a Schottky tuning region 384. Both N and P type dopants may be used to adjust the characteristics of the Schottky diode.

Figure 3B:
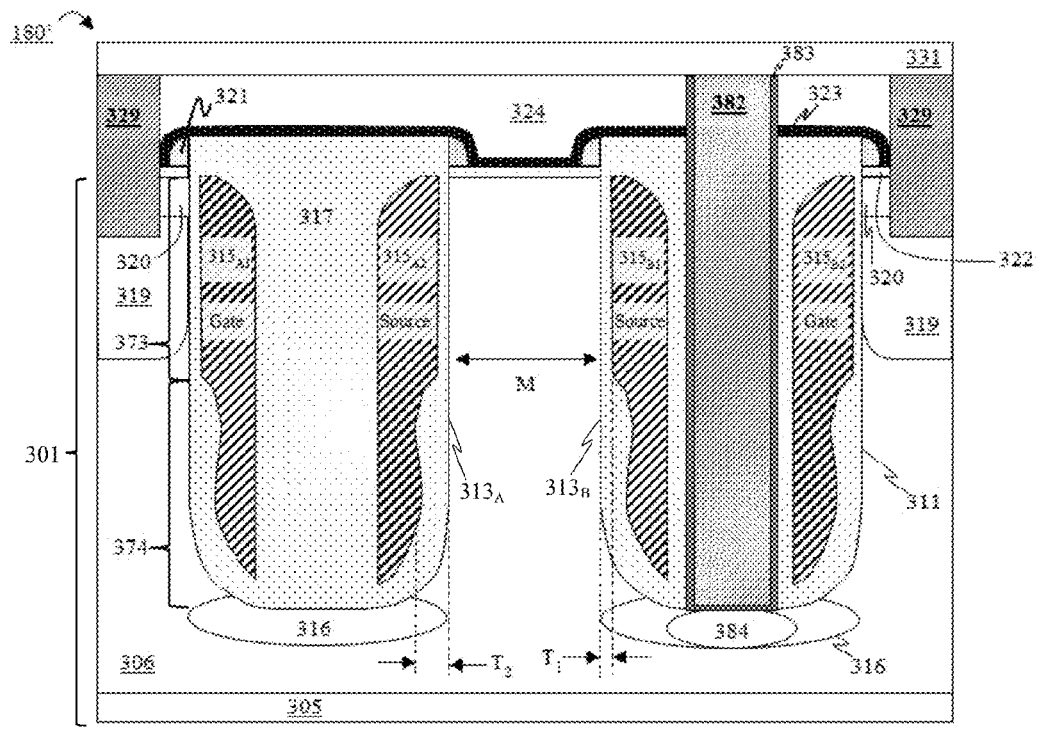

FIG. 3B is a cross-sectional view of the Schottky structure 180' along the line 3B-3B shown in FIG. 1C. The Schottky structure 180' is substantially similar to that of Schottky structure 180 shown in FIG. 3A, except for the location of the Schottky contact 382. The Schottky contact 382 is formed through the bottom of trench $313_B$. In addition to the first and second portions of conductive material $315_{B1}$, $315_{B2}$ formed in trench $315_B$, a vertical connection may be made through the insulative material 317 to form the Schottky contact 382. The Schottky contact may be electrically connected to the source metal 331 and extend through the outer insulator 324, the second insulative layer 323, the trench insulator 317, and the dielectric material 311, thereby connecting the source metal 331 to the drift region 306 and/or the field tuning region 316 below the trench structure. Additionally, dopants may be inserted at the bottom of the trench to create a Schottky tuning region 384 in order to improve the performance of the Schottky diode.

Figure 3C:
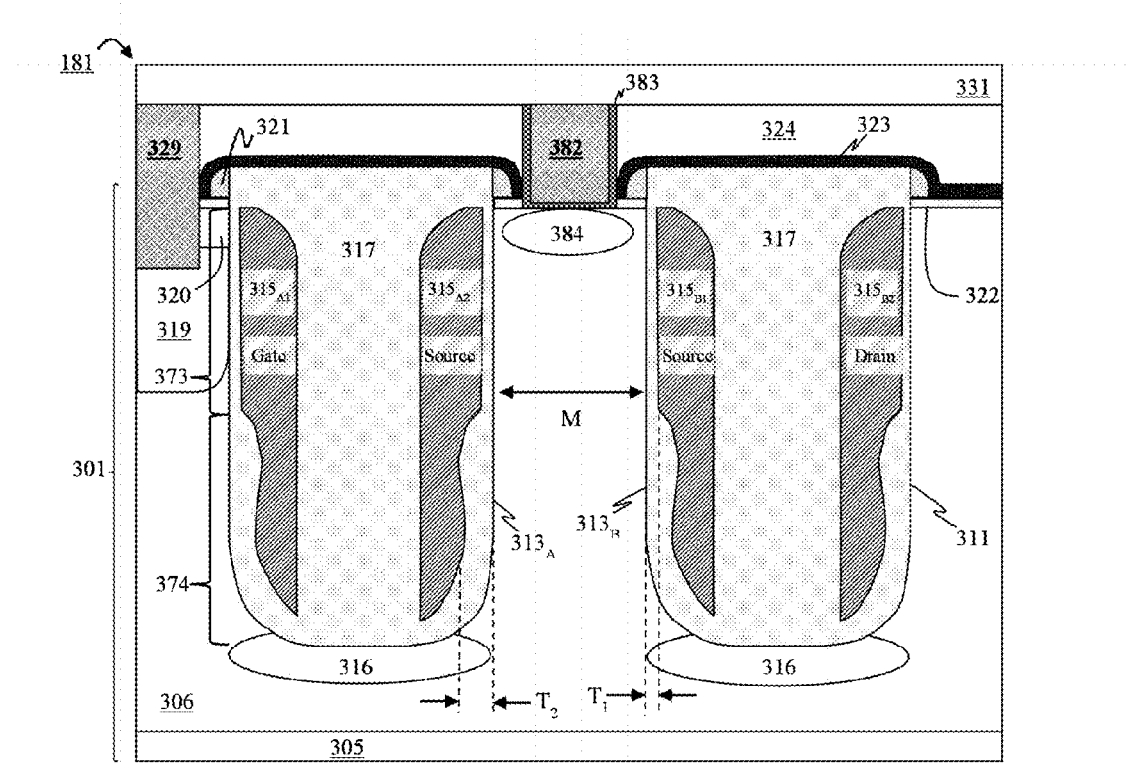

FIG. 3C is a cross-sectional view of a Schottky structure 181 along the line 3C-3C shown in FIG. 2B. The Schottky structure 181 is substantially similar to that of the Schottky structure 180 shown in FIG. 3A, with the exception of the potentials that the conductive portions 315 are maintained. Since Schottky structure 181 is formed in the termination region, the outermost conductive portion $315_{B2}$ furthest from the active area 102 is maintained at the drain potential. The conductive portion $315_{A1}$ nearest to the active area 102 may be maintained at gate potential. The two conductive portions $315_{A2}$, $315_{B1}$ proximate to the mesa M may be maintained at source potential. This may be accomplished using conductive shorting structures, e.g., as depicted in FIG. 2A. Additionally, since the Schottky structure 181 is in the termination region 103, the source 320 and body layers 319 formed outside of the Schottky structure may be omitted. However, in order to allow the active device closest to the termination structure to be a functioning device, the source 319 and body layers 320 may be formed adjacent to the trench $315_A$.

Figure 3D:
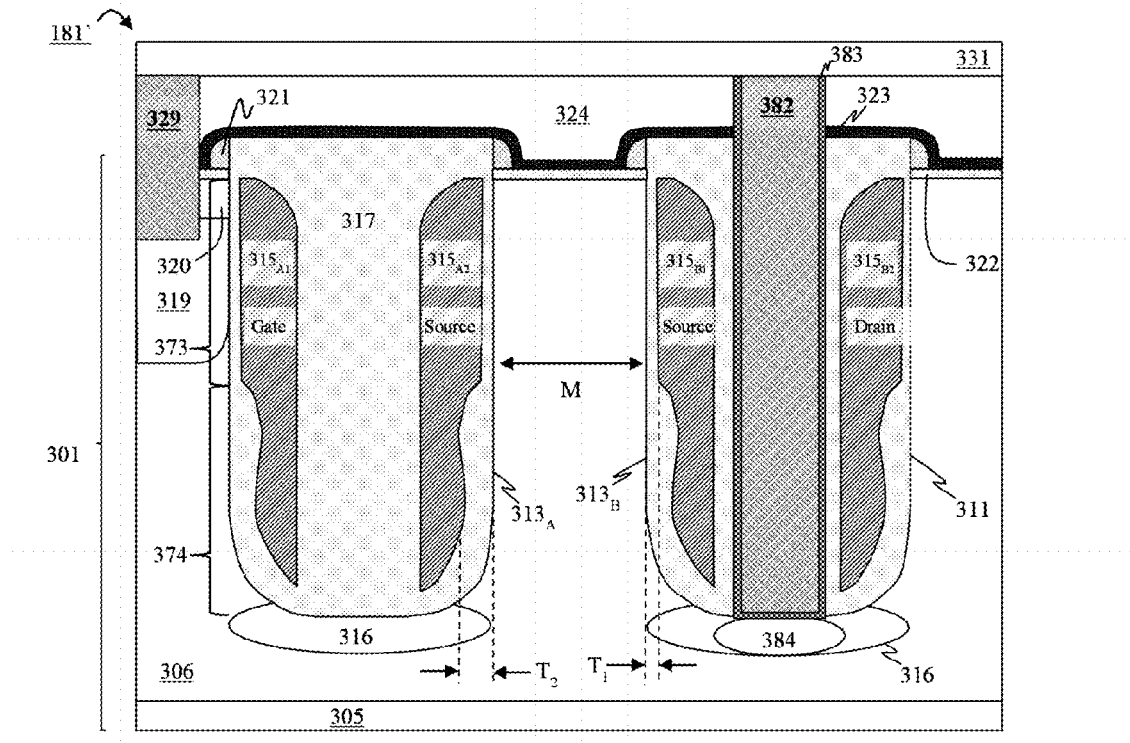

FIG. 3D is a cross-sectional view of the Schottky structure 181' along the line 3D-3D shown in FIG. 2C. The Schottky structure 181' is substantially similar to that of Schottky structure 181 shown in FIG. 3C, except for the location of the Schottky contact 382. The Schottky contact 382 is formed through the bottom of trench $313_B$. In addition to the first and second portions of conductive material $315_{B1}$, $315_{B2}$ formed in trench $315_B$, a vertical connection may be made through the insulative material 317 to form the Schottky contact 382. The Schottky contact 382 may be electrically connected to the source metal 331 and extend through the outer insulator 324, the second insulative layer 323, the trench insulator 317, and the dielectric material 311, thereby connecting the source metal 331 to the drift region 306 and/or the field tuning region 316 below the trench structure $313_B$. Additionally, dopants may be inserted at the bottom of the trench to create a Schottky tuning region 384 in order to improve the performance of the Schottky diode.

Figure 3E:
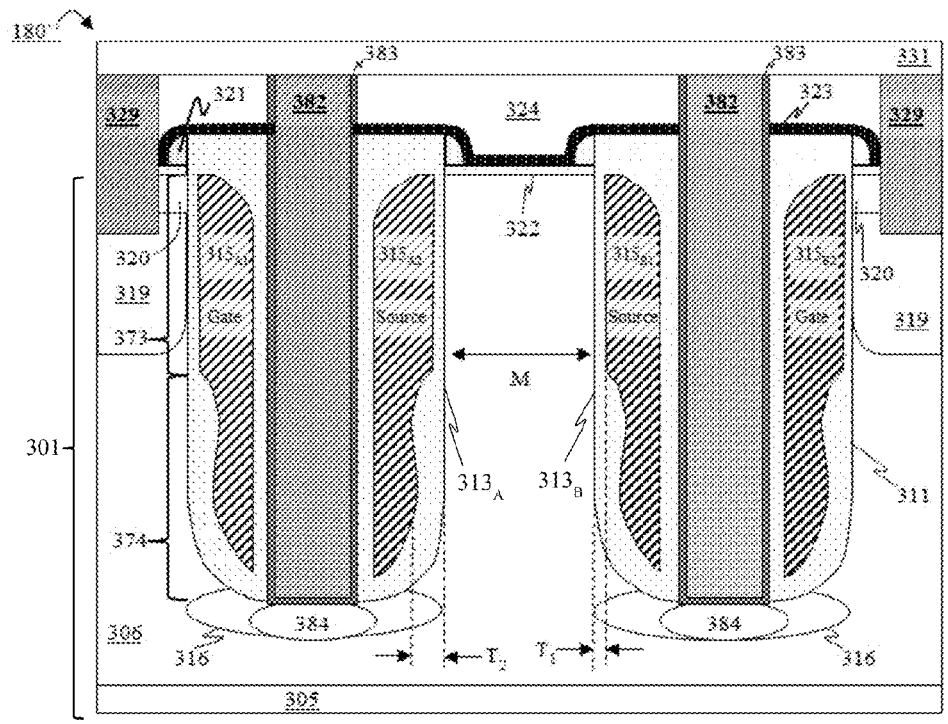

FIG. 3E is a cross-sectional view of a Schottky structure 180" according to an additional aspect of the present disclosure. Schottky structure 180" is substantially similar to Schottky structure 180' shown in FIG. 3B with an additional Schottky contact 182 formed in trench $313_A$. The additional Schottky contact 382 may include a Schottky tuning region 384. Alternatively, one or both of the Schottky tuning regions 384 may be replaced with dopants that would disable the Schottky diode. As such, the same mask sets may be used to fabricate a device with one, two, or zero Schottky diodes. In one example, P-type dopants would be used to disable the Schottky contact. Specially, a p-type dose (e.g. Boron) sufficient to bring the surface concentration to greater than about 1 e18/cm³ would be sufficient to disable the Schottky contact.

Figure 3F:
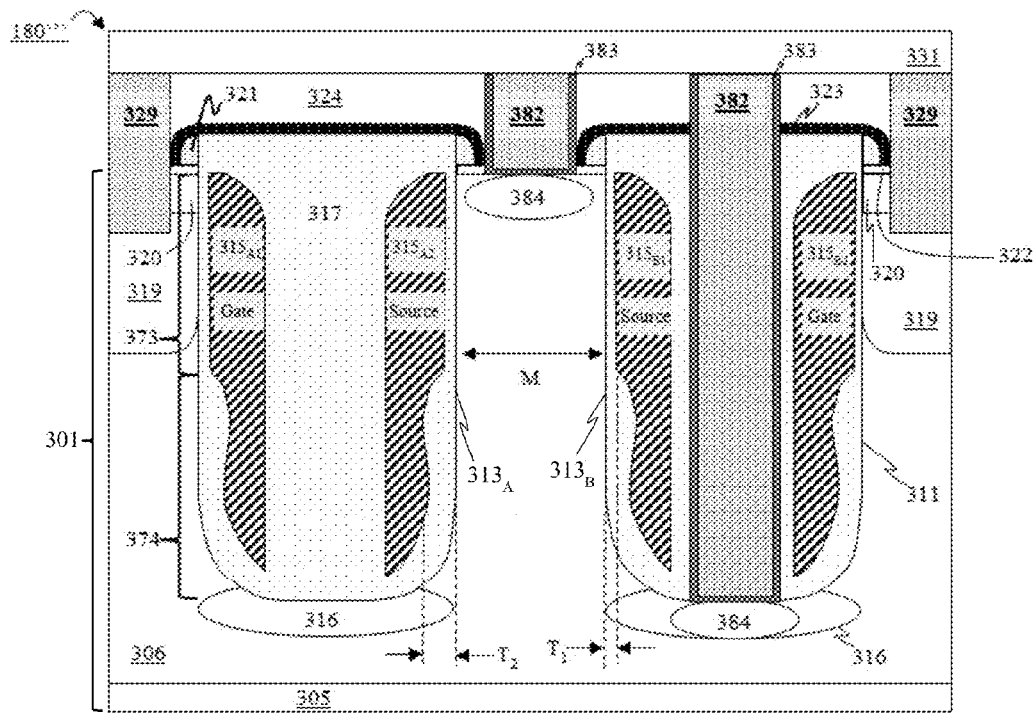

FIG. 3F is a cross-sectional view of a Schottky structure 180''' according to another additional aspect of the present disclosure. Schottky structure 180''' is substantially similar to Schottky structure 180 with an additional Schottky contact 382 incorporated. The second Schottky contact 382 is substantially similar to the Schottky contact 382 utilized in Schottky structure 180'. As such, a Schottky structure 180''' may utilize Schottky contacts located at the mesa M and the substrate 301 below one or both trenches $313_A$ and/or $313_B$.

Figure 3G:
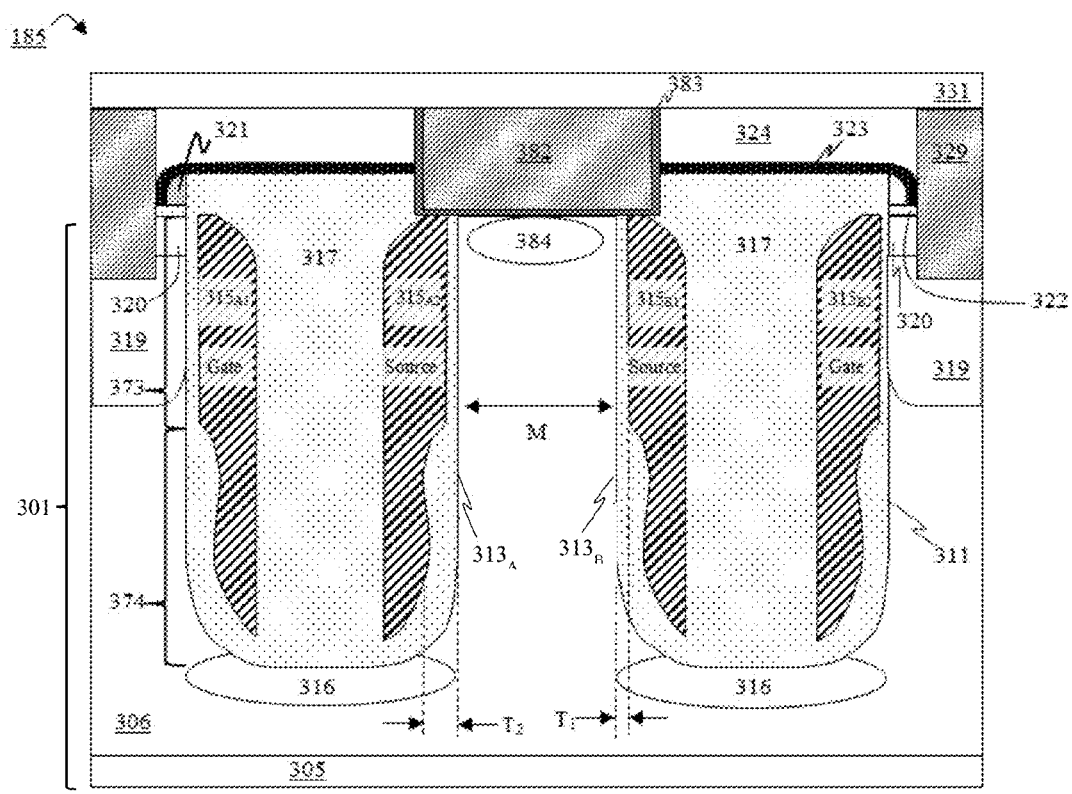

In FIGS. 3A-3F the interior conductive portions (e.g., $315_{A2}$, and $315_{B1}$) are maintained at source potential by a connection in a third dimension that is not shown in the cross-sectional views. In accordance with additional aspects of the present disclosure, the connection to the source metal may be made in the cross-sectional view shown in the figures. Schottky structure 185 shown in FIG. 3G is such a device. Instead of making a connection in the third dimension, the Schottky contact 182 may be widened in order to partially etch through a portion of the insulative material 317 in the trenches $313_A$, $313_B$. As such, the source metal 331 is also connected to the second conductive portion $315_{A2}$ of trench $313_A$ and to the first conductive portion $315_{B1}$ of trench $313_B$. The outer insulative lining 311 along the sidewalls of the trenches remains in place.

Figure 3H:
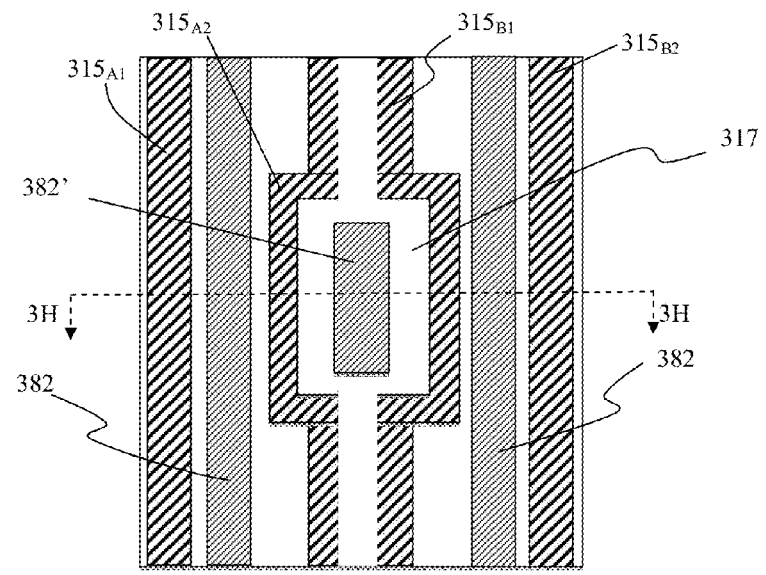
FIG. 3H is a top view of the Schottky structure according to one aspect of the present disclosure.
Figure 3I:
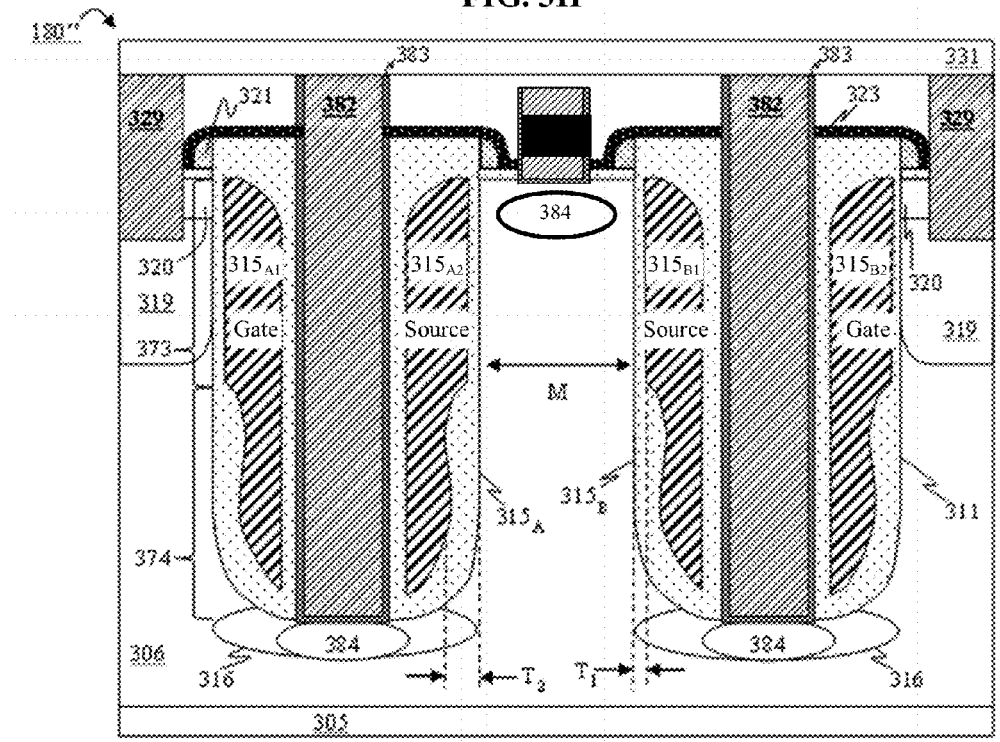
FIG. 3I is a cross-sectional view of FIG. 3H.

FIGS. 3H-3K shows examples of closed cell Schottky structures according to aspects of the present disclosure. FIG. 3H is a top view of a first closed cell Schottky structure and FIG. 3I is a cross-sectional view of the structure shown in FIG. 3H along the line 3H-3H. The structure shown in FIGS. 3H-3I is similar to that depicted in cross-section in FIG. 3A, FIG. 3C and FIG. 3F. However, unlike the structure shown in FIG. 1B and FIG. 2B, the Schottky contact 382' between the trenches $315_A$, $315_B$ is not a continuous stripe. Instead, as may be seen in FIG. 3H, the Schottky contact 382' between trenches 315$_A$, 315$_B$ is a short closed cell vertical contact and the trenches and separate conductive portions 315$_{A2}$, 315$_{B1}$ are configured to detour around the shortened Schottky contact 382'.

Figure 3J:
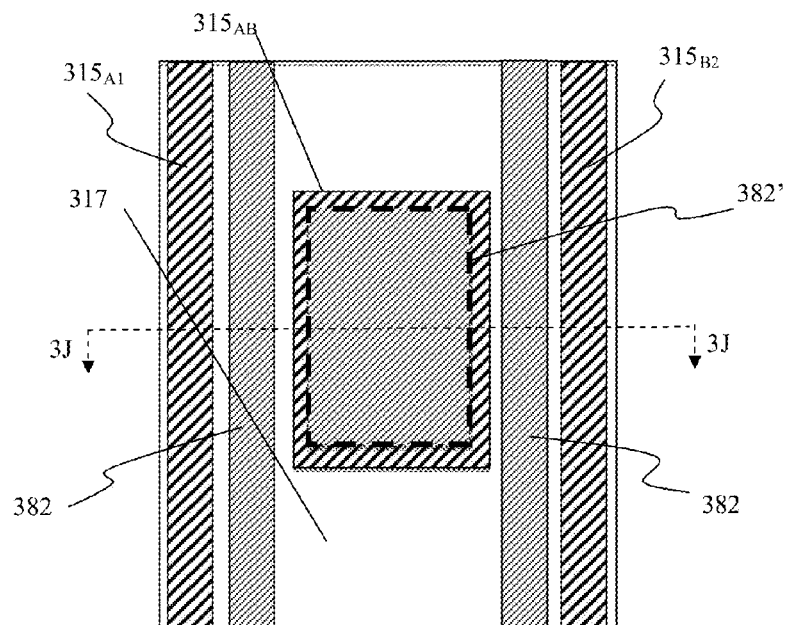
FIG. 3J is a top view of the Schottky structure according to one aspect of the present disclosure.
Figure 3K:
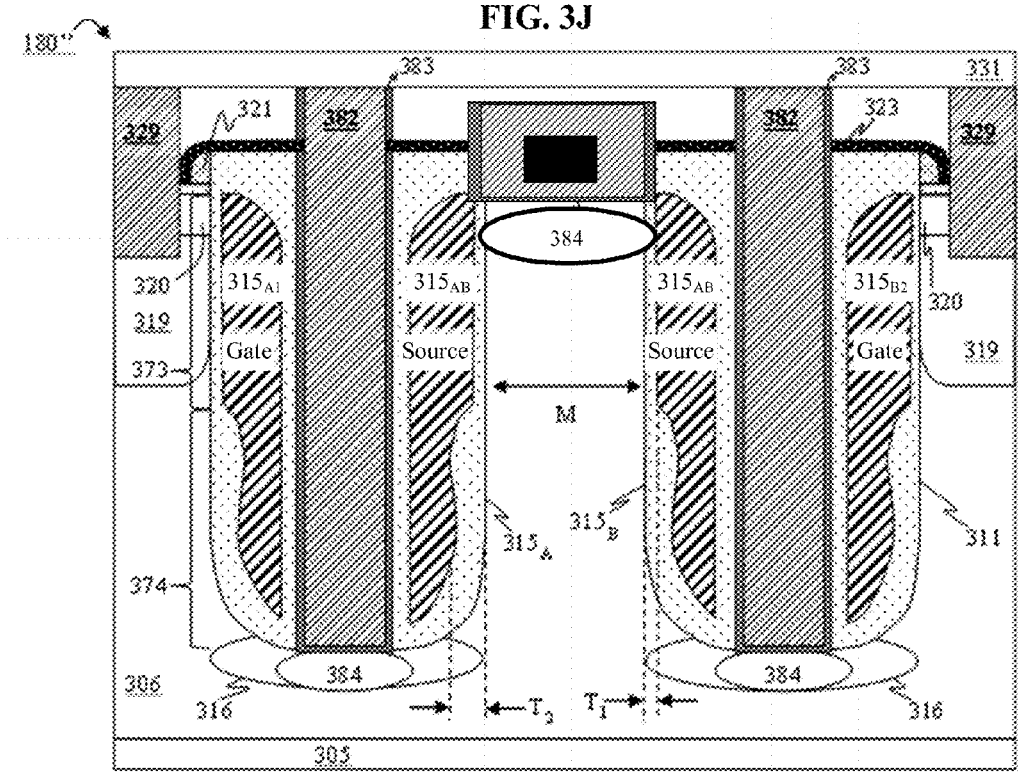
FIG. 3K is a cross-sectional view of FIG. 3J.

FIG. 3J is a top view of an alternative closed cell Schottky structure and FIG. 3K is a corresponding cross-sectional view of the structure of FIG. 3J taken along the line 3J-3J. The structure shown in FIGS. 3J-3K is similar to that depicted in cross-section in FIG. 3G. In particular, the closed cell Schottky structure of FIG. 3J includes a Schottky contact 382' between the trenches 315$_A$, 315$_B$. The Schottky contact 382' overlaps the conductive portions 315$_{AB}$. However, the Schottky contact 382' between the trenches 315$_A$,315$_B$ is not a continuous stripe. Furthermore, the Schottky contact 382' is surrounded by a conductive portion 315$_{AB}$ that is electrically connected to source potential forming a closed-cell Schottky contact.

FIGS. 4A-4M depict a method for forming a device 100 according to an aspect of the present disclosure where the Schottky structure is formed in the active area 102.

Figure 4A:
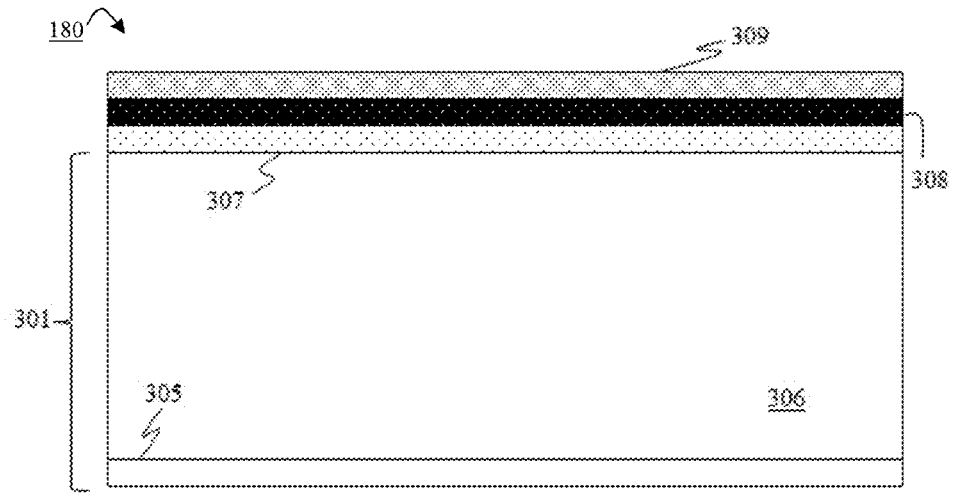
FIGS. 4A-4M are cross-sectional views of a Schottky structure during various processing steps according to an aspect of the present disclosure.

FIG. 4A depicts a semiconductor device structure 100. The device structure may be formed on a substrate 301 that may be suitably doped to be an N-type or a P-type substrate. By way of example, and not by way of limitation, the semiconductor substrate 301 may be an N-type silicon substrate. As used herein, the substrate of device structure 100 will be described as an N-type silicon substrate. The semiconductor substrate 301 may comprise a lightly doped drift region 306 formed in an upper portion of the substrate and a heavily doped drain contact region 305 formed on a bottom portion of the semiconductor substrate. An oxide-nitride-oxide (ONO) hard mask layer may be formed on a top of the lightly doped drift region 306. By way of example and not by way of limitation, the bottom oxide layer 307 may be approximately 200 Å, the nitride layer 308 may be approximately 3500 Å, and the top upper oxide layer 309 may be approximately 1400 Å.

Figure 4B:
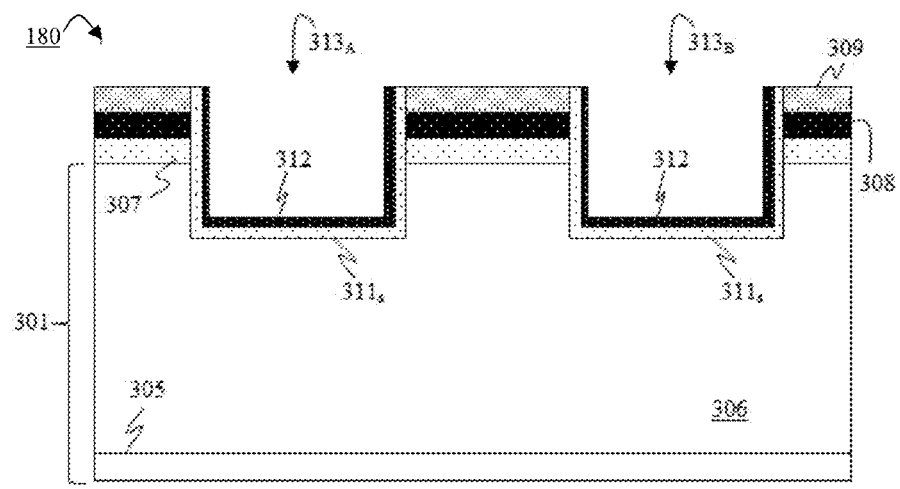

FIG. 4B depicts the device structure 100 after several initial processing steps. First, a trench mask and etching process may be used to form an upper portion of the trenches 313$_A$ and 313$_B$. A trench etching process may comprise an etchant to remove the ONO hard mask layer 307, 308, 309, in order to expose the top surface of the substrate and a second etching process to form the upper portion of trenches 313$_A$ and 313$_B$. By way of example, and not by way of limitation, the upper portion of trenches 313$_A$ and 313$_B$ may be approximately 0.5 μm deep. Trenches 313$_A$ and 313$_B$ may be wider than the trenches used in the active device structures in the active area 102. The width of the trenches 313$_A$ and 313$_B$ may be chosen such that the device trenches in the active area will completely fill with a conductive material during a subsequent trench filling process, whereas the same trench filling process will only cause trenches 313$_A$ and 313$_B$ to be lined with the conductive material. By way of example, and not by way of limitation, the trenches 313$_A$ and 313$_B$ may be twice as large as the device trenches. Once the trenches have been formed, a pad oxide 311$_a$ may be thermally grown in each trench 313 that is approximately 100 Å thick. After the pad oxide 311$_a$ has been grown, a nitride layer 312 may be deposited over the pad oxide 311$_a$. By way of example, and not by way of limitation, the nitride layer 312 may be approximately 500 Å thick.

Figure 4C:
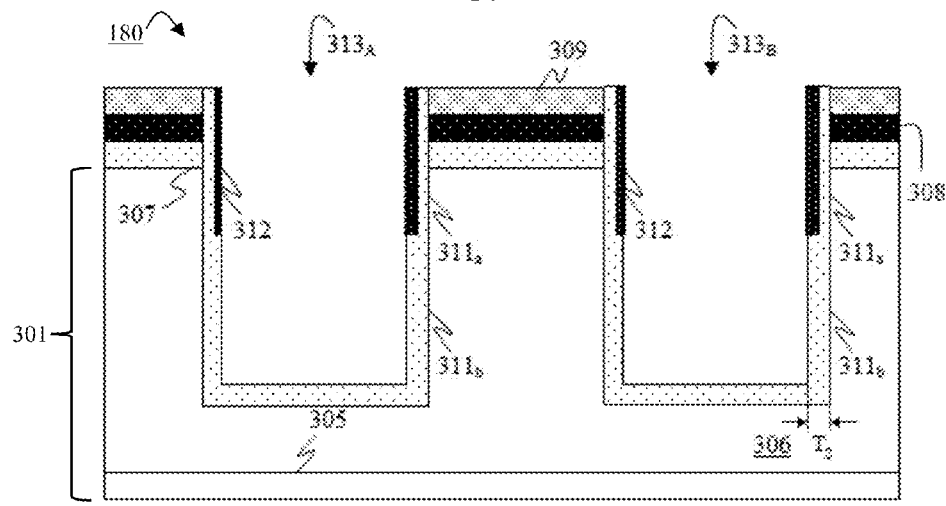

FIG. 4C depicts the formation of the bottom portion of the trenches. First, the nitride layer 312 and the oxide layer 311$_a$ on the bottom surface of the trench may be removed with one or more etching processes. Thereafter, the drift region 306 below the upper portion of the trenches may be etched to increase the depth of the trenches 313$_A$ and 313$_B$. By way of example, and not by way of limitation, the combined depth of the upper and bottom portions of the trenches may be approximately 1.0 μm. Further by way of example, and not by way of limitation, the aspect ratio of the trenches 313 (i.e., the depth of the trench divided by the width of the trench) may be between 1 and 100. Thereafter, a liner oxide 311$_b$ is thermally grown in the exposed silicon at the bottom portion of the trenches. By way of example, the liner oxide 311$_b$ in the bottom portion of the trenches 313 may be grown to a thickness $T_2$ that is approximately 600 Å. The nitride layer 312 along the walls of the upper portion of the trench functions as a mask, and reduces the width of the bottom portion of the trench.

Figure 4D:
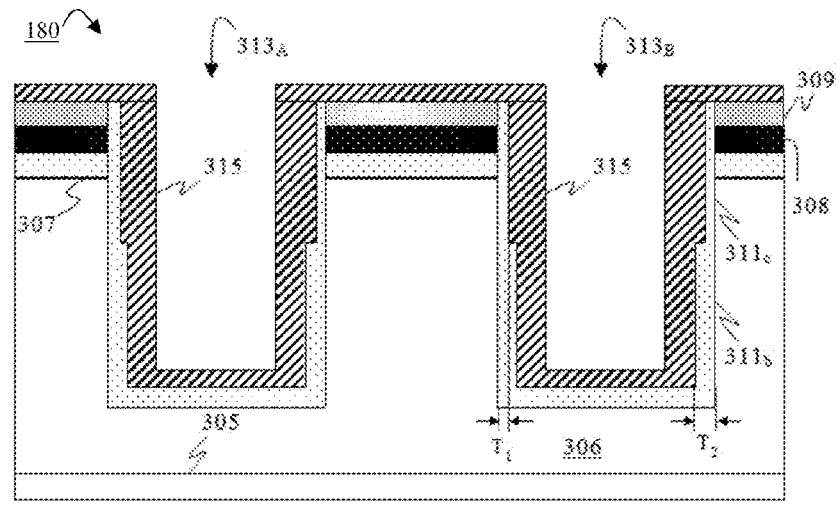

In FIG. 4D the nitride 312 and the pad oxide 311$_a$ at the side wall of the upper portion of the trench are then removed by a wet dip. Then a gate oxide 311$_c$ is grown on the exposed silicon at the side wall of the upper portion of the trenches 313 to a desired thickness $T_1$. By way of example, and not by way of limitation, the thicknesses $T_1$ of the oxide 311$_c$ may be approximately 265 Å for a 12V device. Therefore, the oxides 311 may have a thickness $T_2$ in the bottom portion of the trench that is larger than the thickness $T_1$ of the upper portion of the trench. While the above description describes a thickness of the oxide 311 as being variable with respect to depth in the trench, it is within the scope of the present disclosure to have a uniform gate oxide thickness 311.

Next, in FIG. 4D the trenches 313 are partially filled with a conductive material 315. By way of example, and not by way of limitation, conductive material may be an N$^+$-doped polysilicon, and the polysilicon may be deposited through chemical vapor deposition (CVD). This deposition of the conductive material 315 into the trenches may be done at the same time the gate electrodes 114 are formed in the active area 102. Since the trenches 313 are wider than the trenches for the gate electrodes 114, the conductive material 315 in the trenches 313 will only line the bottom portion and the side walls. It is noted that for the sake of clarity, cross-sectional details of the trench and gate electrode 114 for an device have been omitted. Detailed examples of configuration and fabrication of active devices are described and shown in detail in commonly assigned, co-pending U.S. patent application Ser. No. 13/776, 523, filed Feb. 25, 2013 and fully incorporated herein by reference.

Figure 4E:
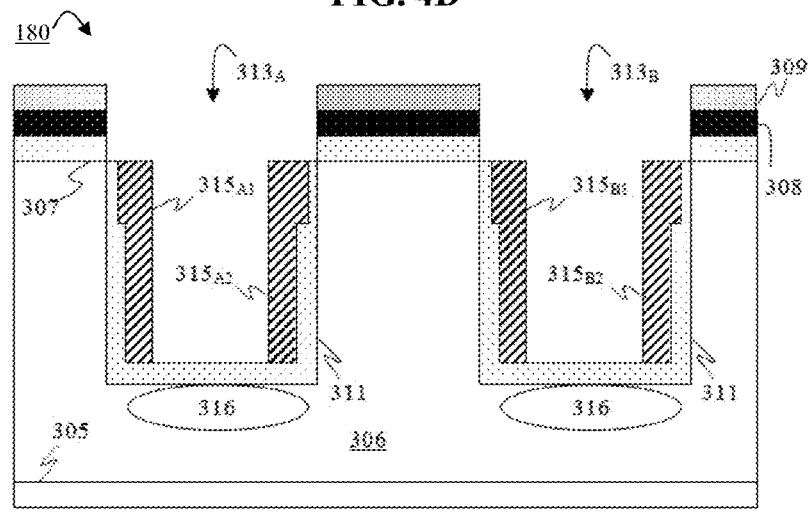

In FIG. 4E the conductive material 315 may be planarized with the surface of the hard mask using chemical mechanical polishing (CMP). Next, as shown in FIG. 4E, the conductive material 315 may be etched back to the surface of the semiconductor substrate. By way of example and not by way of limitation, the etching may be performed with a dry etching process. During this process, the conductive material 315 lining the bottom portion of the trenches 313 may be removed, thereby forming two separate portions of conductive material in each trench. As used herein, in the first trench 313$_A$ the first conductive portion is labeled 315$_{A1}$ and the second conductive portion is labeled 315$_{A2}$. As used herein, in the second trench 313$_B$ the first conductive portion is labeled 315$_{B1}$ and the second conductive portion is labeled 315$_{B2}$. Electrically insulating the first and second portions of conductive material from each other allows for each portion to be maintained at an independent voltage. When the Schottky structure 180 is integrated into the active area of the device 100 it is desirable that the outermost conductive portions (i.e., the first conductive portion 315$_{A1}$ in trench 313$_A$, and the second conductive portion 315$_{B2}$ in trench 313$_B$) are maintained at gate potential. This allows for an active transistor device, e.g., a MOSFET device, bipolar transistor, insulated gate bipolar transistor, junction field effect transistor, or diode or, an inactive device, such as a resistor or capacitor, to be formed between the Schottky structure 180 and the device trenches formed adjacent to the Schottky structure 180. The interior conductive portions (i.e., the second conductive portion $315_{A2}$ in trench $313_A$, and the first conductive portion $315_{B1}$ in trench $313_B$) may be maintained at the source potential. Since the interior conductive portions $315_{A2}$, $315_{B1}$ extend the complete length of the trench, shielding for the Schottky contact may be maximized.

According to an additional aspect of the present disclosure, in which a device 200 includes a Schottky structure 181 that is located in the termination region 103 (as shown in FIG. 3C), the potentials of the conductive portions may be varied. Since Schottky structure 181 is formed in the termination region, the outermost conductive portion $315_{B2}$ furthest from the active area 102 is maintained at the drain potential. The conductive portion $315_{A1}$ nearest to the active area 102 may be maintained at gate potential. The two conductive portions $315_{A2}$, $315_{B1}$ proximate to the mesa M may be maintained at source potential.

Additionally, a field line tuning region 316 may be formed below the trenches $313_A$, $313_B$ after the conductive material 315 at the bottom of the trenches 313 has been removed. The field line tuning region 316 may be formed by implanting dopants of the conductivity type opposite that of the drift region 306. By way of example, and not by way of limitation, boron can be implanted with a dose in a range of $2\,e^{11}$ to $5\,e^{12}$ atoms/cm² at an energy of about 30 to 80 KeV.

Figure 4F:
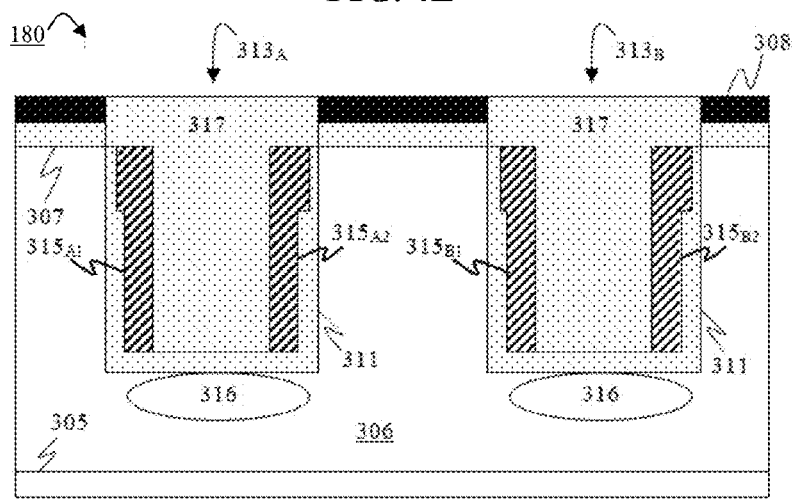

In FIG. 4F the trenches $313_A$, $313_B$ are filled with the insulative material 317. By way of example, and not by way of limitation, the insulative material 317 may be an oxide. The insulative material 317 electrically separates the first and second portions of the conductive trench material $315_{A1}$ and $315_{A2}$ in trench $313_A$, and the first and second portions of the conductive trench material $315_{B1}$ and $315_{B2}$. Once the insulative material 317 has been formed, the top oxide layer 309 of the ONO hardmask may be removed by CMP. The insulative material 317 may also be planarized with the nitride layer 308 with CMP.

Figure 4G:
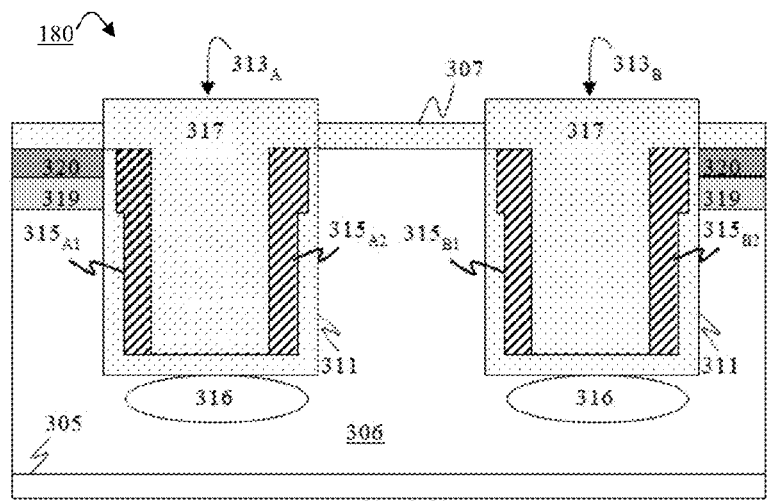
Figure 4G:
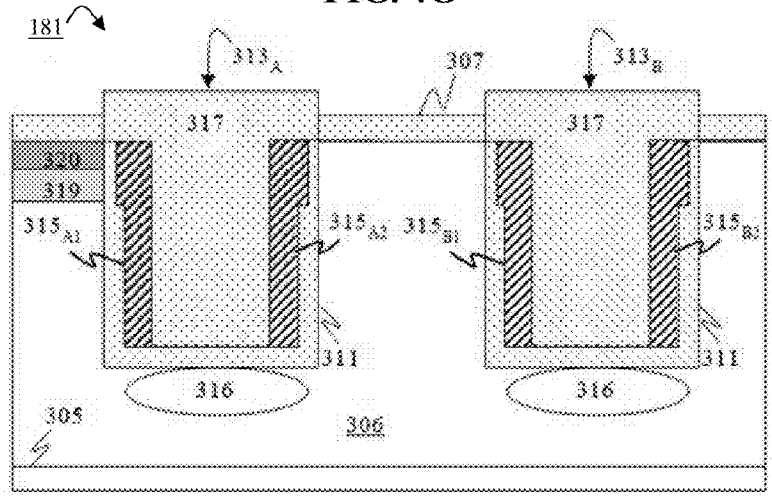

In FIG. 4G the nitride layer 308 of the ONO hardmask may be removed. By way of example, the hardmask may be selectively removed with a hot-phosphoric acid wet dip. Thereafter, the body region 319 may be formed. By way of example, and not by way of limitation, the body region 319 may be formed with a body mask and a blanket implantation, or through selectively implanting ions with an ion implantation system. FIG. 4G also shows the formation of the source region 320. By way of example, and not by way of limitation, the source region 320 may be formed with a source mask and a blanket source implantation, or through selectively implanting ions with an ion implantation system. The mesa M between the trenches 313 may be blocked from receiving the body implant and the source implant.

FIG. 4G' depicts the formation of the source and body regions according to an additional aspect of the present disclosure, in which a device 200 includes a Schottky structure 181 that is located in the termination region 103 (as shown in FIG. 3C). The body and source masks may also prevent the dopants from being implanted proximate to the outermost conductive portion $315_{B2}$. The subsequent processing of Schottky structure 181 is substantially similar to that of Schottky structure 180 after the source and body implants.

Figure 4H:
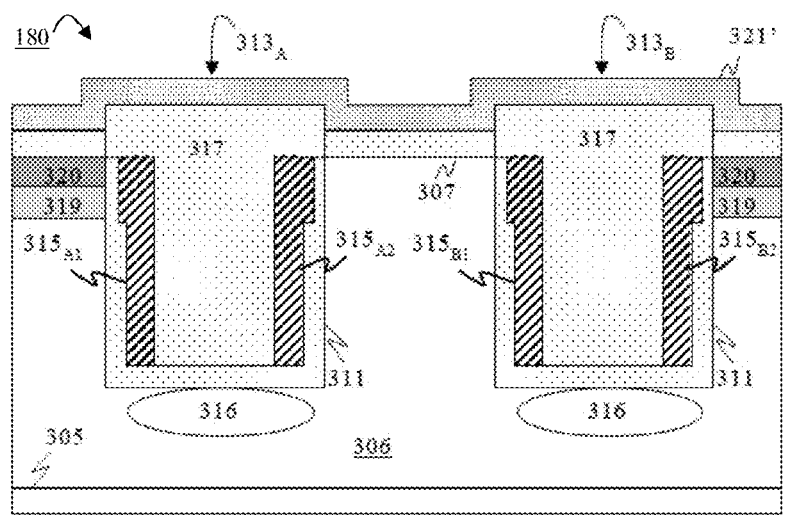
Figure 4I:
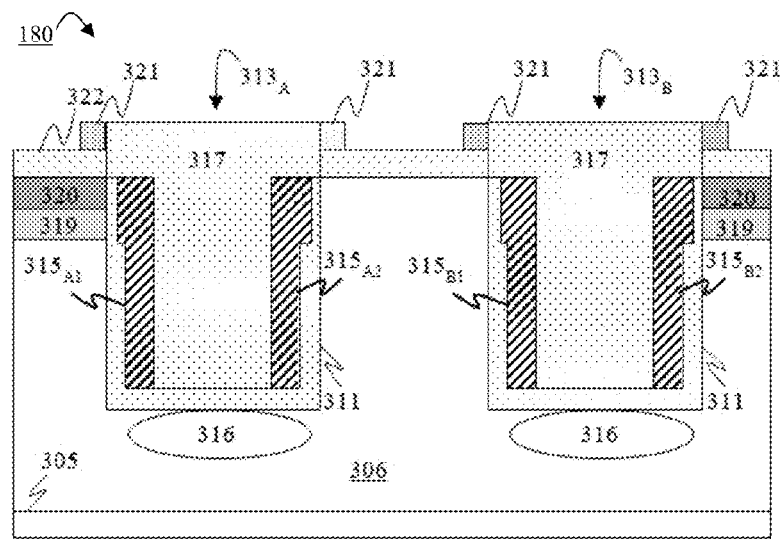

FIG. 4H depicts the deposition of a thick sacrificial insulation layer 321'. By way of example, the sacrificial insulation layer may be approximately 1,100 Å thick. Further by way of example, the insulation layer 321' may be an oxide deposited by CVD with a source gas such as TEOS. Alternatively, the insulation layer 321' may be a nitride material that is deposited with a CVD process using a $SiH_4$ and $NH_3$ gas mixture. Next, in FIG. 4I the thick insulation layer 321' may be etched using an anisotropic etch, such as a dry etching process, in order to form the first insulating spacers 321 along the sides of the exposed insulative material 317. By way of example, the insulation spacers 321 may be approximately 1000 Å thick. When the insulation layer 321' is an oxide, the etching process may stop on the silicon substrate's surface, thus removing portions of the bottom oxide layer 307 from the ONO hardmask that are not located below the first insulating spacers 321. A pad oxide 322 may then be grown over the surface of the substrate. By way of example, and not by way of limitation, the pad oxide 322 may be approximately 100 Å thick.

Alternatively, a similar process may be used for forming the first insulating spacers 321 in a device that utilizes a sacrificial insulation layer 321' that is a nitride material. In this situation the anisotropic etching process may selectively etch away the nitride material and leave the bottom oxide layer 307 of the ONO hardmask in place. As such, there is no need to grow the pad oxide 322. Once the first insulating spacers 321 have been formed, the processing of a device that has first insulating spacers that are made from a nitride material would then continue in substantially the same manner as that described for a process where the first insulating spacers 321 are made from an oxide.

Figure 4J:
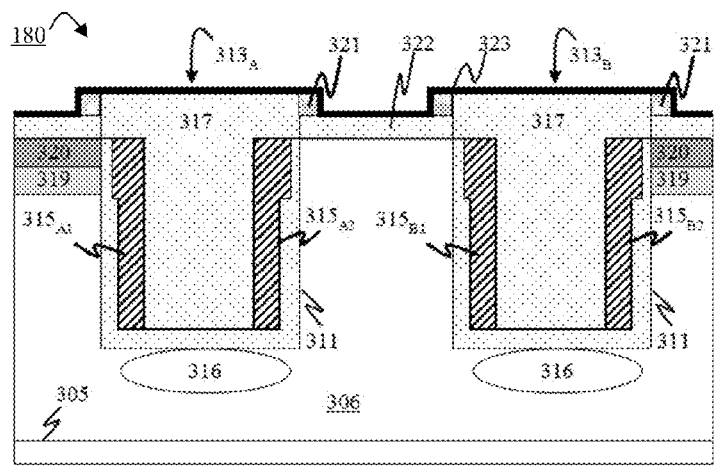
Figure 4K:
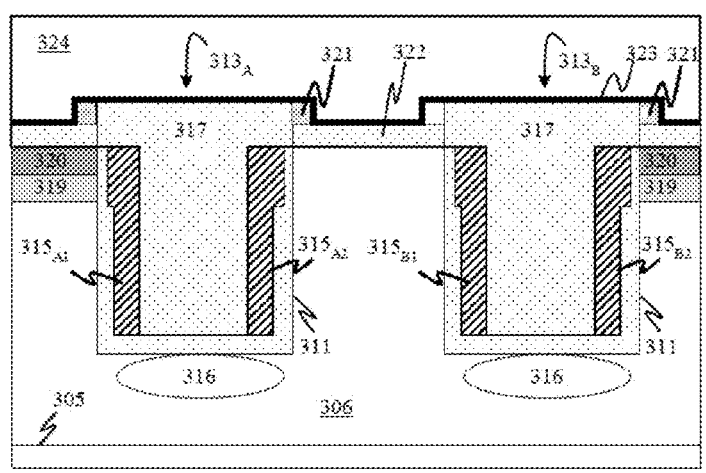

After the first insulating spacers 321 have been formed, a sacrificial nitride layer 323 may be deposited over the surface as shown in FIG. 4J. By way of example, the nitride layer 323 may be approximately 300 Å thick. The nitride layer 323 may be deposited with a CVD process using a $SiH_4$ and $NH_3$ gas mixture. As shown in FIG. 4K, a thick layer of borophosphosilicate glass (BPSG) 324 may then be deposited over the nitride layer 323 with a CVD process.

Figure 4L:
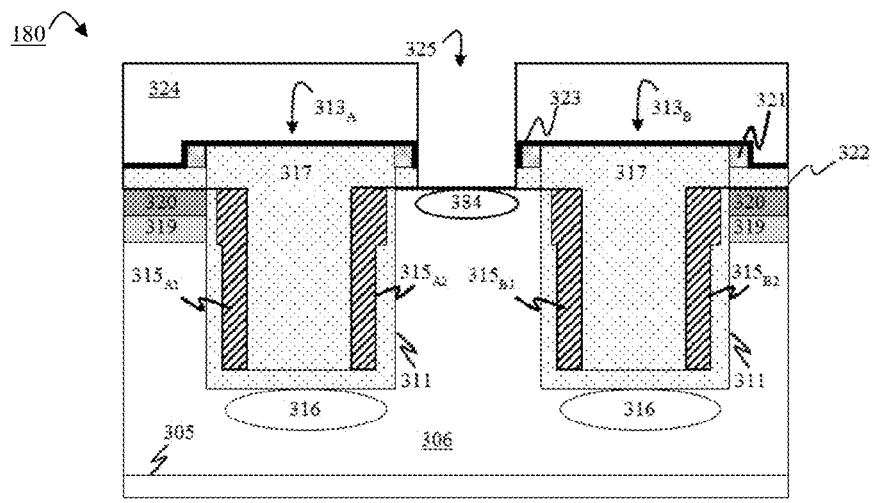

A contact mask may be used in FIG. 4L to form a Schottky trench 325 that provides access for conductive vertical connections to reach the mesa M in order to form a Schottky contact 382. The etching process may utilize three separate etching steps. First, an etchant may be used that will remove the BPSG layer 324 and will not remove the nitride layer 323 below the BPSG. This allows for a fast etch, since there is no chance of over etching due to the nitride stop layer 323. A second etchant may then be used to selectively etch through the nitride layer 323. Thereafter, a third etchant may be used that has a high selectivity for oxide in order to break through the pad oxide layer 322. Additionally, a Schottky tuning region 384 may be formed at the top surface of the mesa M. By way of example, and not by way of limitation, the Schottky tuning region 384 may be formed by implanting dopants into the top surface of the Mesa. The implant used to tune the Schottky performance, sometimes referred to as a Shannon implant, may be designed to adjust the barrier height of the Schottky interface. This is usually done by lowering, but not inverting, the local dopant concentration at the metal-silicon interface. In such a case, the implant species is that opposite to that of the lightly doped drift region. For the case of an n-type drift layer, the implant would be boron or $BF_2$ with a dose in the range of about 1 e11 to about 1 e12 at energy of about 30 KeV. This is an example only, and other combinations of the implant parameters, which would achieve the same goal, are certainly possible.

Figure 4M:
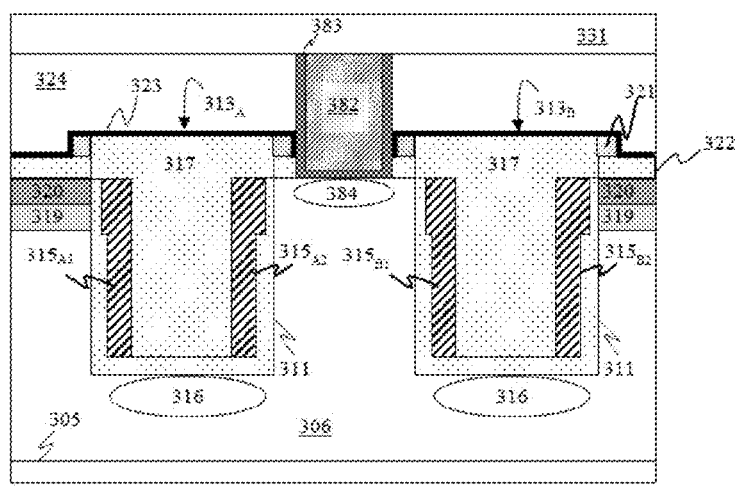

In FIG. 4M a barrier metal 383 may be deposited over the surface of the Schottky trench 325. By way of example, and not by way of limitation, the barrier metal may be titanium that is deposited through physical vapor deposition (PVD), or it may be an alloy such as TiN which may be deposited by CVD or PVD. After the barrier metal has been deposited, a conductive material may be deposited in order to form the Schottky contact 382. By way of example, and not by way of limitation, the Schottky contact 382 may be made of tungsten that is deposited by CVD. Once the layer of tungsten has been deposited, it may be etched back in order to leave the tungsten primarily in the vertical contact holes. Metal may then be deposited over the entire surface to provide appropriate contacts to source and the gate. Finally, a metal mask may be used to etch away portions of the deposited metal in order to electrically isolate the contact areas into a source metal 331, and a gate metal (not shown).

Figure 5A:
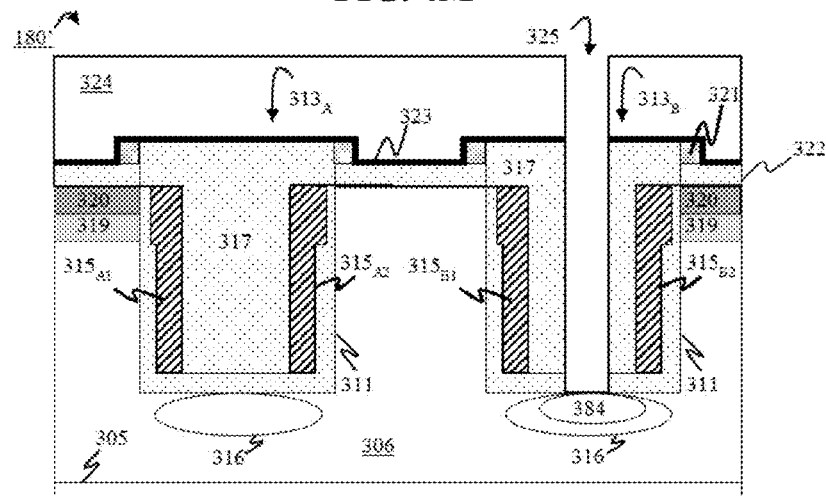
FIGS. 5A-5B are cross-section views of a Schottky structure during processing according to an additional aspect of the present disclosure.
Figure 5B:
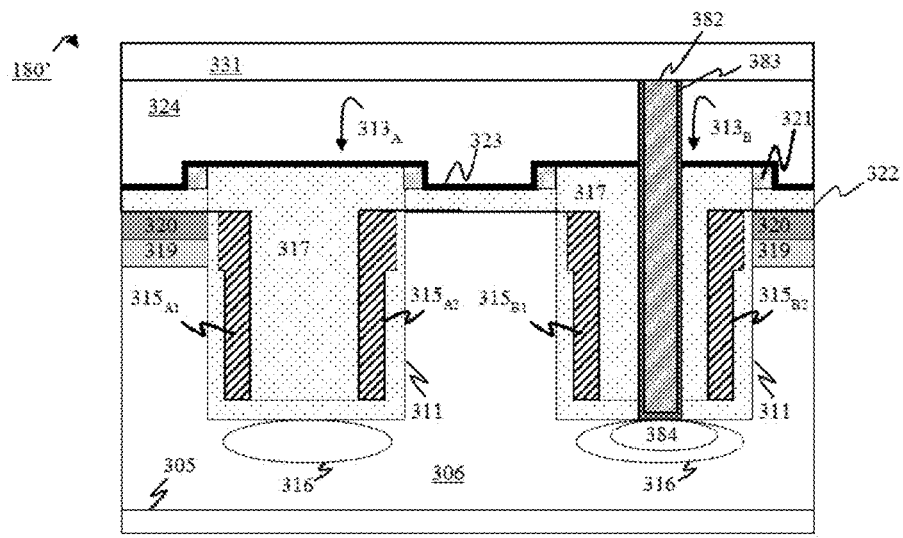

FIGS. 5A-5B depict additional steps that may be utilized in order to form a device 100 with a Schottky structure 180' that is shown in FIG. 3B. Device 100' follows the same processing flow described in FIGS. 4A-4K. However, instead of forming the Schottky trench 325 above the mesa M, the Schottky trench is formed through the center of each trench $313_B$ as shown in FIG. 5A. A Schottky tuning region 384 may be implanted at the bottom of the Schottky trench 325. A properly doped Schottky tuning region will allow the Schottky contact to function properly. However, if the doping concentration is altered in the Schottky tuning region, then the Schottky contact may be optionally deactivated. This is beneficial because it allows for a device with or without a Schottky contact to be formed with a single mask set.

After the Schottky trench 325 has been formed and the desired dopants have been implanted into the Schottky tuning region, the Schottky contacts may be formed. In FIG. 5B a barrier metal 383 may be disposed on the sidewalls and bottom surface of the trench 325. By way of example, and not by way of limitation, the barrier metal may be titanium that is deposited through physical vapor deposition (PVD), or it may be an alloy such as TiN which may be deposited by CVD or PVD. After the barrier metal has been deposited, a conductive material may be deposited in order to form the Schottky contact 382. By way of example, and not by way of limitation, the Schottky contact 382 may be made of tungsten that is deposited by CVD. Once the layer of tungsten has been deposited, it may be etched back in order to leave the tungsten primarily in the vertical contact holes. Metal may then be deposited over the entire surface to provide appropriate contacts to source and the gate. Finally, a metal mask may be used to etch away portions of the deposited metal in order to electrically isolate the contact areas into a source metal 331, and a gate metal (not shown).

Figure 6A:
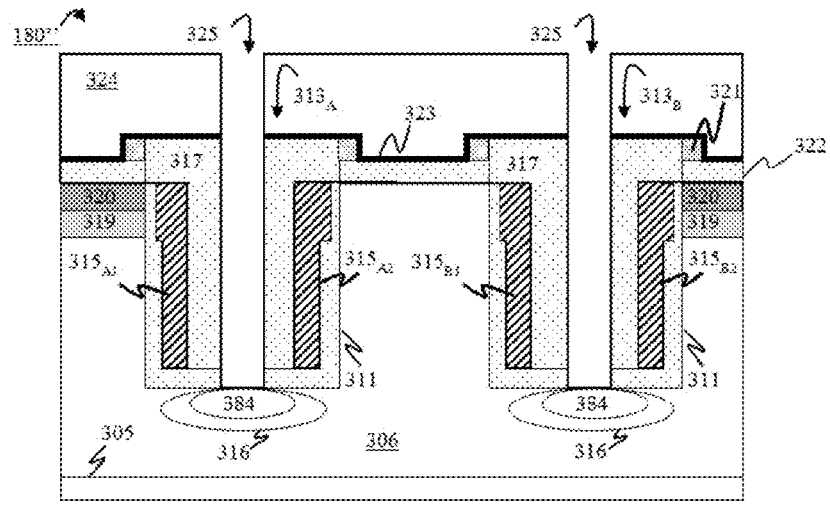
FIGS. 6A-6B are cross-section views of a Schottky structure during processing according to an additional aspect of the present disclosure.
Figure 6B:
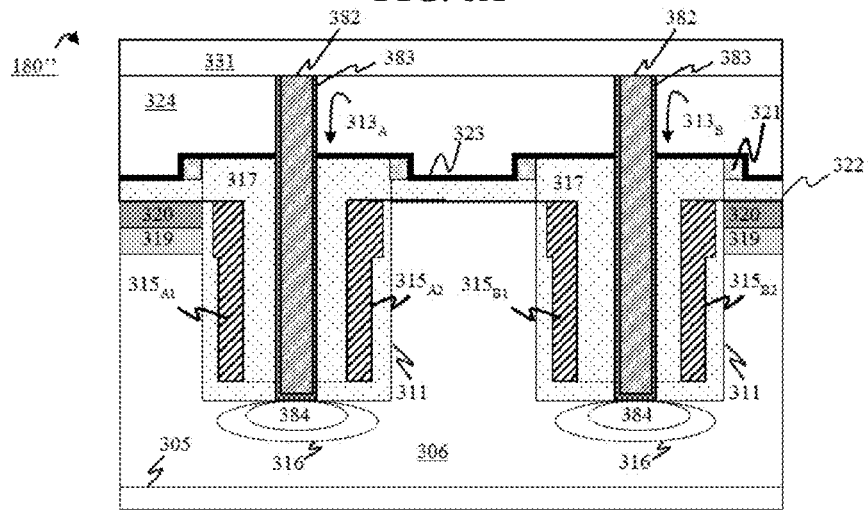

FIGS. 6A-6B depict additional steps that may be utilized in order to form a device 100 with a Schottky structure 180" that is shown in FIG. 3E. Schottky structure 180" follows the same processing flow described in FIGS. 4A-4K. However, instead of forming the Schottky trench 325 above the mesa M, two Schottky trenches are formed through the center of each trench $313_A$ and $313_B$ as shown in FIG. 6A. A Schottky tuning region 384 may be implanted at the bottom one or both of each Schottky trenches 325. The control of the doping at the bottom of the trench allows for there to be one, two, or zero Schottky contacts in the device. A properly doped Schottky tuning region will allow the Schottky contact to function properly. However, if the doping concentration is altered in the Schottky tuning region, then the Schottky contact may be optionally deactivated. This is beneficial because it allows for different numbers of Schottky contacts to be formed with a single mask set.

After the Schottky trenches 325 have been formed and the desired dopants have been implanted into the Schottky tuning region, the Schottky contacts may be formed. In FIG. 6B a barrier metal 383 may be disposed on the sidewalls and bottom surface of the trenches 325. By way of example, and not by way of limitation, the barrier metal may be titanium that is deposited through physical vapor deposition (PVD), or it may be an alloy such as TiN which may be deposited by CVD or PVD. After the barrier metal has been deposited, a conductive material may be deposited in order to form the Schottky contact 382. By way of example, and not by way of limitation, the Schottky contact 382 may be made of tungsten that is deposited by CVD. Once the layer of tungsten has been deposited, it may be etched back in order to leave the tungsten primarily in the vertical contact holes. Metal may then be deposited over the entire surface to provide appropriate contacts to source and the gate. Finally, a metal mask may be used to etch away portions of the deposited metal in order to electrically isolate the contact areas into a source metal 331, and a gate metal (not shown).

Figure 7A:
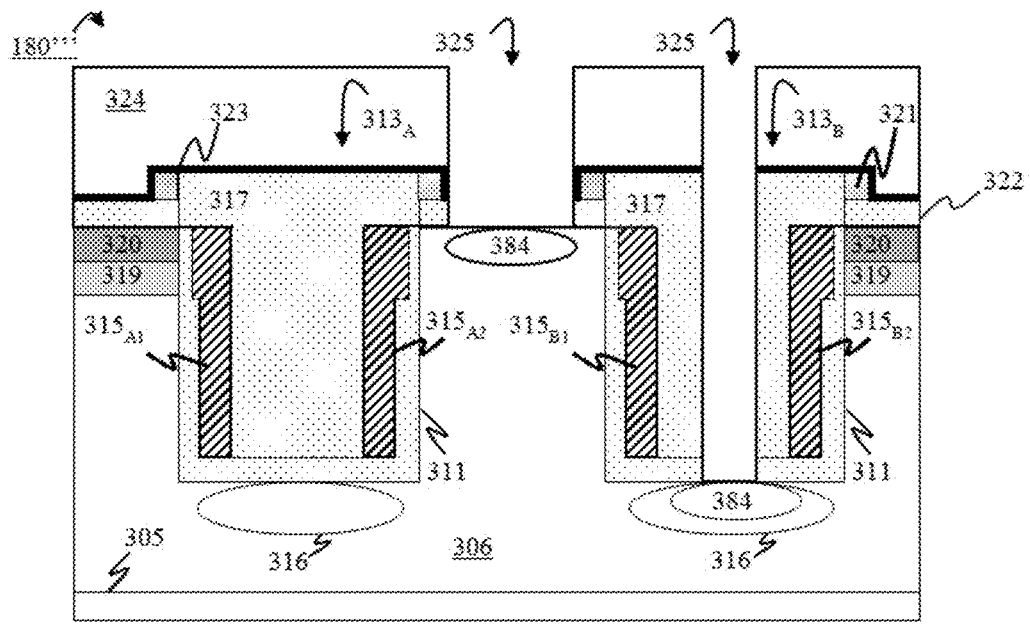
FIGS. 7A-7B are cross-section views of a Schottky structure during processing according to an additional aspect of the present disclosure.
Figure 7B:
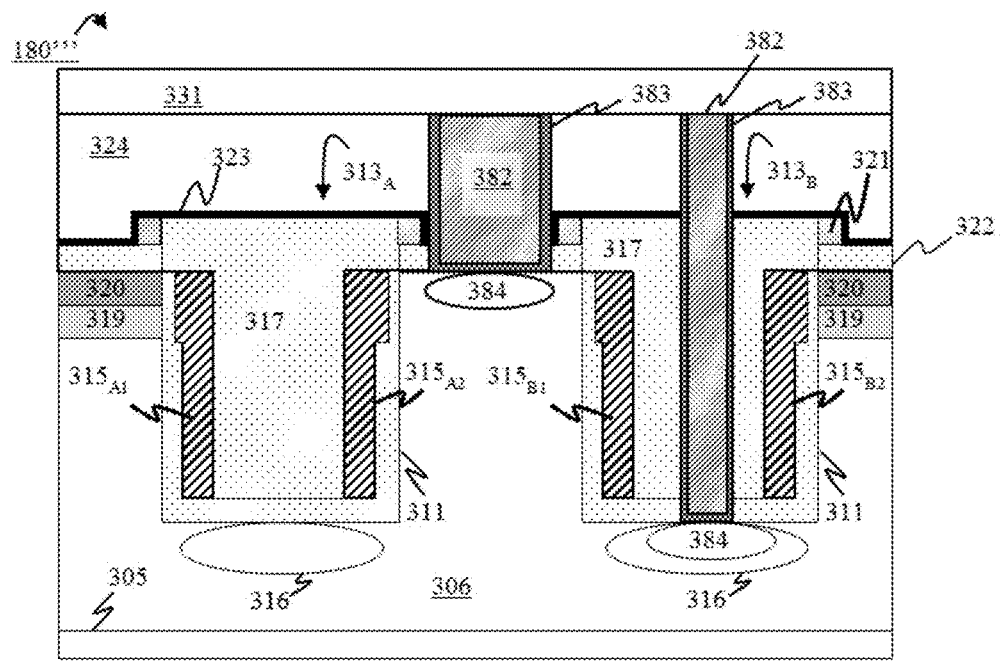

FIGS. 7A-7B depict additional steps that may be utilized in order to form a device 100 with a Schottky structure 180''' that is shown in FIG. 3F. Schottky structure 180''' follows the same processing flow described in FIGS. 4A-4K. However, instead of forming the Schottky trench 325 only above the mesa M, an additional Schottky trench may be formed through the center of one or both trenches $313_A$ and $313_B$ as shown in FIG. 7A. Once the trenches 325 have been formed the processing continues in substantially the same manner described above with respect to forming the Schottky contacts 382. FIG. 7B depicts the finished Schottky structure 180''' with a Schottky contact 382 contacting the mesa M and contacting the substrate 301 below the trench $313_B$. Similar to the Schottky contacts described in alternative aspects of the present disclosure, the Schottky trenches 325 may be lined with a barrier metal 383, and a Schottky tuning region 384 may be formed below the Schottky contacts.

Figure 8A:
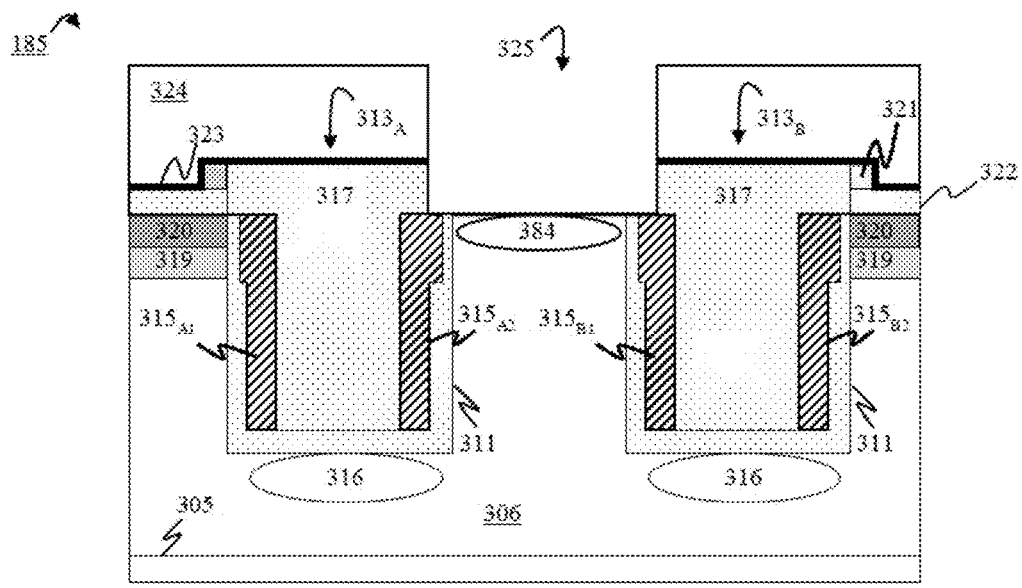
FIGS. 8A-8B are cross-section views of a Schottky structure during processing according to an additional aspect of the present disclosure.
Figure 8B:
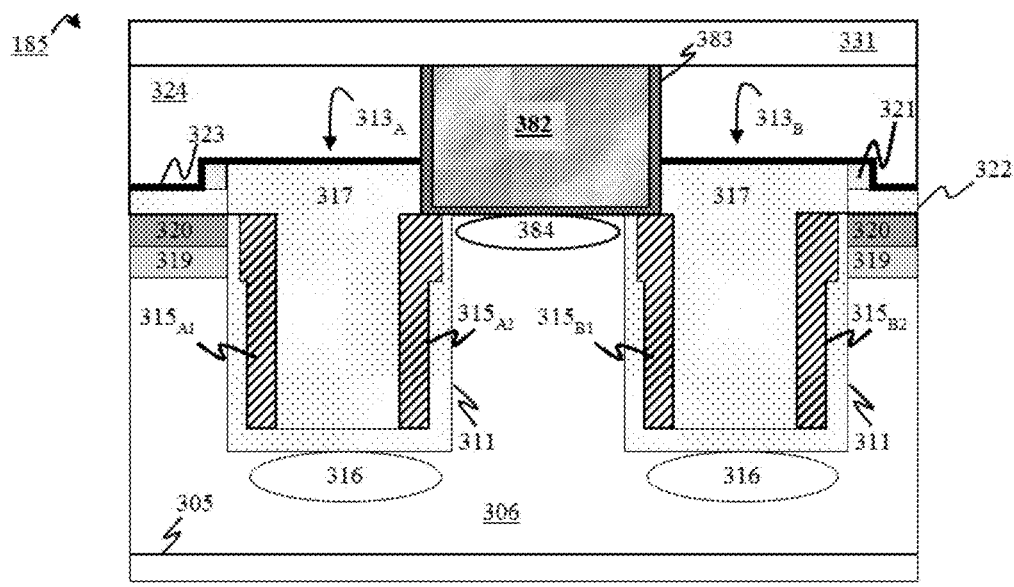

FIGS. 8A-8B depict additional steps that may be utilized in order to form a device 100 with a Schottky structure 185 that is shown in FIG. 3G. Schottky structure 185 follows the same processing flow described in FIGS. 4A-4K. However, instead of forming the Schottky trench 325 only above the mesa M, the Schottky trench 325 is made wider in order to make electrical contact with the second portion of conductive material $315_{A2}$ in trench $313_A$, and with the first portion of conductive material $315_{B1}$ in trench $313_B$, as shown in FIG. 8A. FIG. 8B depicts the finished Schottky structure 185 with a Schottky contact 382 contacting the mesa M and contacting the conductive portions $315_{A2}$ and $315_{B1}$. Similar to the Schottky contacts described in alternative aspects of the present disclosure, the Schottky trench 325 may be lined with a barrier metal 383, and a Schottky tuning region 384 may be formed below the Schottky contact in the mesa M.

The present disclosure describes a device structure and method to implement an integrated Schottky diode into system that can include both active and passive devices. By way of example, but not limitation, a power MOSFET has been selected to by the primary active device for this disclosure, due to its ubiquity in the industry and importance in power electronics. Any device structure constructed from the method described in this disclosure would be a candidate for integration with a Schottky diode as described herein. Such devices include, but are not limited to, active devices such as bipolar transistors, insulated gate bipolar transistors (IGBTs), junction field effect transistors (JFETs) and diodes and passive devices such as resistors and capacitors. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A Schottky structure comprising:
two trenches formed into a semiconductor material and spaced apart from each other by a mesa, wherein each trench is lined with a dielectric material, and wherein a first portion of conductive material is disposed along a first sidewall of each trench and a second portion of conductive material is disposed along a second sidewall of each trench, and wherein the first and second portions of conductive material are electrically isolated from each other, wherein the first portion of conductive material in the first trench is maintained at a gate potential; and
one or more Schottky contacts formed between the outermost walls of the two trenches, wherein the one or more Schottky contacts extend in a direction parallel to the two trenches.

2. The Schottky structure of claim 1, wherein the two trenches are formed in an active region of a MOSFET device.

3. The Schottky structure of claim 2, wherein the first portion of conductive material in the first trench is maintained at a gate potential, the second portion of conductive material in the first trench is maintained at a source potential, the first portion of conductive material in the second trench is maintained at the source potential, and the second portion of conductive material in the second trench is maintained at the gate potential.

4. The Schottky structure of claim 1, wherein the two trenches are formed in a termination region of a MOSFET device.

5. The Schottky structure of claim 4, wherein the first portion of conductive material in the first trench is maintained at a gate potential, the second portion of conductive material in the first trench is maintained at a source potential, the first portion of conductive material in the second trench is maintained at the source potential, and the second portion of conductive material in the second trench is maintained at drain potential.

6. The Schottky structure of claim 1, wherein a width of the mesa between the two trenches is equal to a width of a mesa between device trenches formed in the semiconductor material.

7. The Schottky structure of claim 1, wherein a width of the mesa between the two trenches is smaller than a device mesa separating device trenches.

8. The Schottky structure of claim 7, wherein the width of the mesa between the two trenches is between one fourth and three fourths of the width of the device mesa.

9. The Schottky structure of claim 1, wherein the Schottky contact is formed in the mesa between the two trenches.

10. The Schottky structure of claim 9, wherein the Schottky contact further contacts the conductive portions in each trench proximate to the mesa.

11. The Schottky structure of claim 1, wherein one of the one or more Schottky contacts is formed in one of the trenches between the first conductive portion and the second conductive portion.

12. A Schottky structure comprising:
two trenches formed into a semiconductor material and spaced apart from each other by a mesa, wherein each trench is lined with a dielectric material, and wherein a first portion of conductive material is disposed along a first sidewall of each trench and a second portion of conductive material is disposed along a second sidewall of each trench, and wherein the first and second portions of conductive material are electrically isolated from each other; and
two or more Schottky contacts formed between the outermost walls of the two trenches, wherein the two or more Schottky contacts extend in a direction parallel to the two trenches, wherein two of the two or more Schottky contacts are formed in the two trenches respectively between the first conductive portions and the second conductive portions, wherein at least one of the two or more Schottky contacts is deactivated by selectively doping the semiconductor material with dopants configured to prevent a Schottky diode from forming.

13. The Schottky structure of claim 1, wherein a first Schottky contact is formed in the mesa between the two trenches and a second Schottky contact is formed in at least one of the trenches between the first conductive portion and the second conductive portion.

14. The Schottky structure of claim 13, wherein the second Schottky contact is configured as a closed cell structure.

15. The Schottky structure of claim 1, wherein the Schottky structure is integrated into a bipolar transistor, insulated gate bipolar transistor (IGBT), junction field effect transistor (JFET), a diode, a resistor or a capacitor.

* * * * *